US007259410B2

(12) United States Patent
Jaiprakash et al.

(10) Patent No.: US 7,259,410 B2
(45) Date of Patent: Aug. 21, 2007

(54) DEVICES HAVING HORIZONTALLY-DISPOSED NANOFABRIC ARTICLES AND METHODS OF MAKING THE SAME

(75) Inventors: Venkatachalam C. Jaiprakash, Woburn, MA (US); Jonathan W. Ward, Burlington, MA (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 21 days.

(21) Appl. No.: 10/776,059

(22) Filed: Feb. 11, 2004

(65) Prior Publication Data

US 2004/0181630 A1    Sep. 16, 2004

Related U.S. Application Data

(63) Continuation-in-part of application No. 10/341,005, filed on Jan. 13, 2003, and a continuation-in-part of application No. 10/128,118, filed on Apr. 23, 2002, now Pat. No. 6,706,402, and a continuation-in-part of application No. 10/033,323, filed on Dec. 28, 2001, now Pat. No. 6,911,682, and a continuation-in-part of application No. 09/915,093, filed on Jul. 25, 2001, now Pat. No. 6,919,592.

(60) Provisional application No. 60/446,783, filed on Feb. 12, 2003, provisional application No. 60/446,786, filed on Feb. 12, 2003.

(51) Int. Cl.
*H01L 27/10* (2006.01)
(52) U.S. Cl. .................. 257/208; 257/40; 977/734; 977/742
(58) Field of Classification Search ............ 977/1, 977/734, 742; 257/208, 40
See application file for complete search history.

(56) References Cited

U.S. PATENT DOCUMENTS 6,128,214 A    10/2000    Kuekes et al.

(Continued)

OTHER PUBLICATIONS

Choi, W.B. et al., "Carbon-nanotube-based nonvolatile memory with oxide-nitride-film and nanoscale channel," *Appl. Phys. Lett.*, 2003, vol. 82(2), pp. 275-277.

(Continued)

*Primary Examiner*—Douglas M. Menz
(74) *Attorney, Agent, or Firm*—Wilmer, Cutler, Pickering, Hale & Dorr LLP

(57) ABSTRACT

New devices having horizontally-disposed nanofabric articles and methods of making same are described. A discrete electromechanical device includes a structure having an electrically-conductive trace. A defined patch of nanotube fabric is disposed in spaced relation to the trace; and the defined patch of nanotube fabric is electromechanically deflectable between a first and second state. In the first state, the nanotube article is in spaced relation relative to the trace, and in the second state the nanotube article is in contact with the trace. A low resistance signal path is in electrical communication with the defined patch of nanofabric. Under certain embodiments, the structure includes a defined gap into which the electrically conductive trace is disposed. The defined gap has a defined width, and the defined patch of nanotube fabric spans the gap and has a longitudinal extent that is slightly longer than the defined width of the gap. Under certain embodiments, a clamp is disposed at each of two ends of the nanotube fabric segment and disposed over at least a portion of the nanotube fabric segment substantially at the edges defining the gap. Under certain embodiments, the clamp is made of electrically-conductive material. Under certain embodiments, the contact between the nanotube patch and the trace is a nonvolatile state. Under certain embodiments, the contact between the nanotube patch and the trace is a volatile state. Under certain embodiments, the at least one electrically conductive trace has an interface material to alter the attractive force between the nanotube fabric segment and the electrically conductive trace.

4 Claims, 20 Drawing Sheets

U.S. PATENT DOCUMENTS

| | | | |
|---|---|---|---|
| 6,159,620 | A | 12/2000 | Heath et al. |
| 6,183,714 | B1 | 2/2001 | Smalley et al. |
| 6,198,655 | B1 | 3/2001 | Heath et al. |
| 6,221,330 | B1 | 4/2001 | Moy et al. |
| 6,231,980 | B1 | 5/2001 | Cohen et al. |
| 6,232,706 | B1 | 5/2001 | Dai et al. |
| 6,445,006 | B1 | 9/2002 | Brandes et al. |
| 6,518,156 | B1 | 2/2003 | Chen |
| 6,548,841 | B2 | 4/2003 | Frazier et al. |
| 6,559,468 | B1 | 5/2003 | Kuekes et al. |
| 6,574,130 | B2 | 6/2003 | Segal et al. |
| 6,643,165 | B2 | 11/2003 | Segal et al. |
| 6,673,424 | B1 | 1/2004 | Lindsay |
| 6,706,402 | B2 | 3/2004 | Rueckes et al. |
| 6,750,471 | B2 | 6/2004 | Bethune et al. |
| 6,759,693 | B2 | 7/2004 | Vogeli et al. |
| 6,774,052 | B2 | 8/2004 | Vogeli et al. |
| 6,781,166 | B2 | 8/2004 | Lieber et al. |
| 6,784,028 | B2 | 8/2004 | Rueckes et al. |
| 6,803,840 | B2 | 10/2004 | Hunt et al. |
| 6,809,465 | B2 | 10/2004 | Jin |
| 2002/0130311 | A1 | 9/2002 | Lieber et al. |
| 2002/0130353 | A1 | 9/2002 | Lieber et al. |
| 2002/0172963 | A1 | 11/2002 | Kelley et al. |
| 2002/0175390 | A1 | 11/2002 | Goldstein et al. |
| 2002/0179434 | A1 | 12/2002 | Dai et al. |
| 2003/0021966 | A1 | 1/2003 | Segal et al. |
| 2003/0124325 | A1 | 7/2003 | Rueckes et al. |
| 2003/0165074 | A1 | 9/2003 | Segal et al. |
| 2003/0234407 | A1 | 12/2003 | Vogeli et al. |
| 2003/0236000 | A1 | 12/2003 | Vogeli et al. |
| 2004/0085805 | A1 | 5/2004 | Segal et al. |
| 2004/0159833 | A1 | 8/2004 | Rueckes et al. |
| 2004/0164289 | A1 | 8/2004 | Rueckes et al. |
| 2004/0175856 | A1 | 9/2004 | Jaiprakash et al. |
| 2004/0191978 | A1 | 9/2004 | Rueckes et al. |
| 2004/0214366 | A1 | 10/2004 | Segal et al. |
| 2004/0214367 | A1 | 10/2004 | Segal et al. |

FOREIGN PATENT DOCUMENTS

| | | |
|---|---|---|
| WO | WO 01/03208 A1 | 1/2001 |
| WO | WO 01/44796 A1 | 6/2001 |

OTHER PUBLICATIONS

Dequesnes, M. et al., "Calculation of pull-in voltages for carbon-nanotube-based nanoelectromechanical switches," *Nanotechnology*, 2002, vol. 13, pp. 120-131.

Dequesnes, M. et al., "Simulation of carbon nanotube-based nanoelectromechanical switches," *Computational Nanoscience and Nanotechnology*, 2002, pp. 383-386.

Wolf, S., Silicon Processing for the VLSI Era; vol. 2—Process Integration, Multi-Level-Interconnect Technology for VLSI and ULSI, 1990, Section 4.3 Materials for Multilevel Interconnect Technologies, pp. 189-191, Lattice Press, Sunset Beach.

Wolf, S., Silicon Processing for the VLSI Era; vol. 2—Process Integration, 1990, Section 4.7 Manufacturing Yield and Reliability Issues of VLSI Interconnects, pp. 260-273, Lattice Press, Sunset Beach.

Robinson, L.A.W., "Self-Aligned Electrodes for Suspended Carbon Nanotube Structures," *Microelectronic Engineering*, 2003, vols. 67-68, pp. 615-622.

Cui, J.B. et al., "Carbon Nanotube Memory Devices of High Charge Storage Stability," *Appl. Phys. Lett.*, 2002, vol. 81(17), pp. 3260-3262.

Tour, J. M. et al., "NanoCell Electronic Memories," *J. Am. Chem Soc.*, 2003, vol. 125, pp. 13279-13283.

Rueckes, T., et al., "Carbon Nanotube-Based Nonvolatile Random Access Memory for Molecular Computing" *Science*, 2000, vol. 289, pp. 94-97.

Fan, S. et al., "Carbon nanotube arrays on silicon substrates and their possible application," *Physica E*, 2000. vol. 8, pp. 179-183.

Zhan, W. et al., "Microelectrochemical Logic Circuits," *J. Am. Chem. Soc.*, 2003, vol. 125, pp. 9934-9935.

Soh, H. T. et al., "Integrated nanotube circuits: Controlled growth and ohmic contacting of single-walled carbon nanotubes," *Appl. Phys. Lett.*, 1999. vol. 75(5), pp. 627-629.

Kinaret, J.M. et al., "A carbon-nanotube-based nanorelay", *Appl. Phys. Lett.*, 2003, vol. 82(8), pp. 1287-1289.

Franklin, N. R. et al., "Integration of suspended carbon nanotube arrays into electronic devices and electromechanical systems," *Appl. Phys. Lett.*, 2002, vol. 81(5), pp. 913-915.

Avouris, Ph., "Carbon nanotube electronics," Chem. Physics, 2002, vol. 281, pp. 429-445.

Dai, H. et al., "Controlled Chemical Routes to Nanotube Architectures, Physics, and Devices," *J. Phys. Chem . B*, 1999, vol. 103, pp. 111246-111255.

Homma, Y. et al., "Growth of Suspended Carbon Nanotubes Networks on 100-nm-scale Silicon Pillars," *Appl. Phys. Lett.*, 2002, vol. 81(12), pp. 2261-2263.

Ajayan, P.M., et al., "Nanometre-size tubes of carbon," *Rep. Prog. Phys.*, 1997, vol. 60, pp. 1025-1062.

Sreekumar, T.V., et al., "Single-wall Carbon Nanotube Films", *Chem. Mater.* 2003, vol. 15, pp. 175-178.

Verissimo-Alves, M. et al., "Electromechanical effects in carbon nanotubes: *Ab initio* and analytical tight-binding calculations," *Phys. Rev. B*, 2003, vol. 67, pp. 161401-1-161401-4.

Fuhrer, M.S. et al., "High-Mobility Nanotube Transistor Memory," *Nano Letters*, 2002, vol. 2(7), pp. 755-759.

Radosavljevic, M. et al., "Nonvolatile molecular memory elements based on ambipolar nanotube field effect transistors," *Nano Letters*, 2002, vol. 2(7), pp. 761-764.

Farajian, A. A. et al., "Electronic transport through bent carbon nanotubes: Nanoelectromechanical sensors and switches," *Phys. Rev. B*, 2003, vol. 67, pp. 205423-1-205423-6.

Fischer, J.E. et al., "Magnetically aligned single wall carbon nanotube films: Preferred orientation and anisotropic transport properties," *Journal of Appl. Phys.*, 2003, vol. 93(4), pp. 2157-2163.

Lee, K.-H. et al., "Control of growth orientation for carbon nanotubes," *Appl, Phys. Lett.*, 2003, vol. 82(3), pp. 448-450.

Casavant, M.J. et al., "Neat macroscopic membranes of aligned carbon nanotubes," *Journal of Appl. Phys.*, 2003, vol. 93(4), pp. 2153-2156.

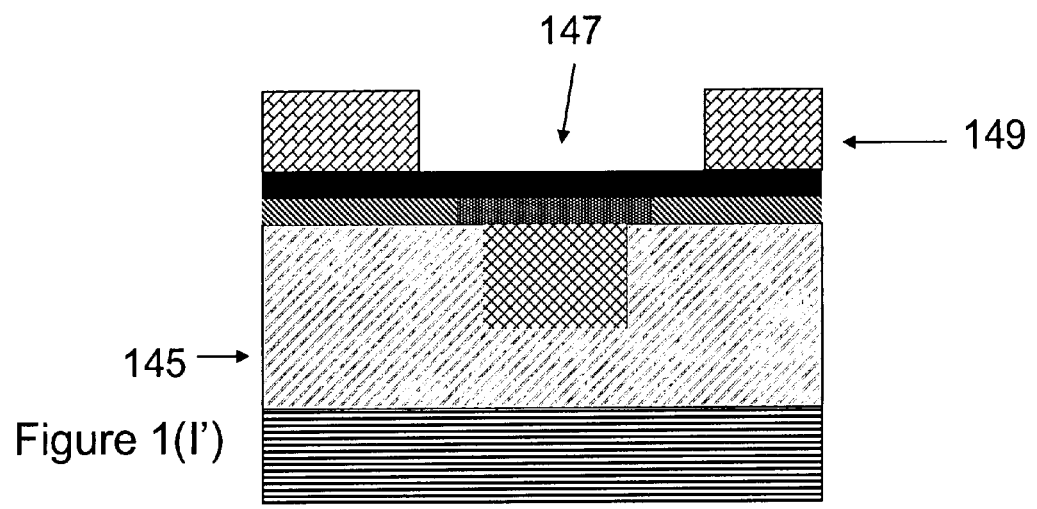
Figure 1(I')
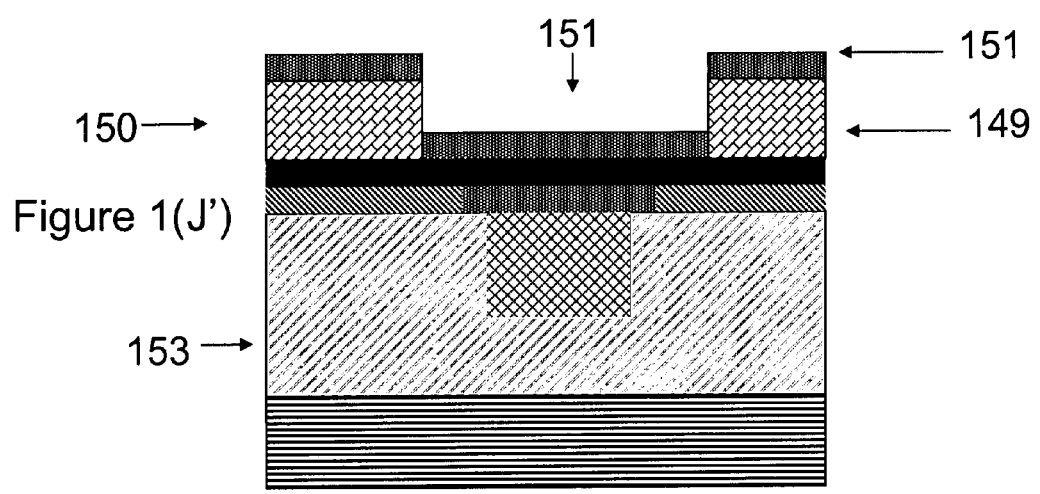
Figure 1(J')

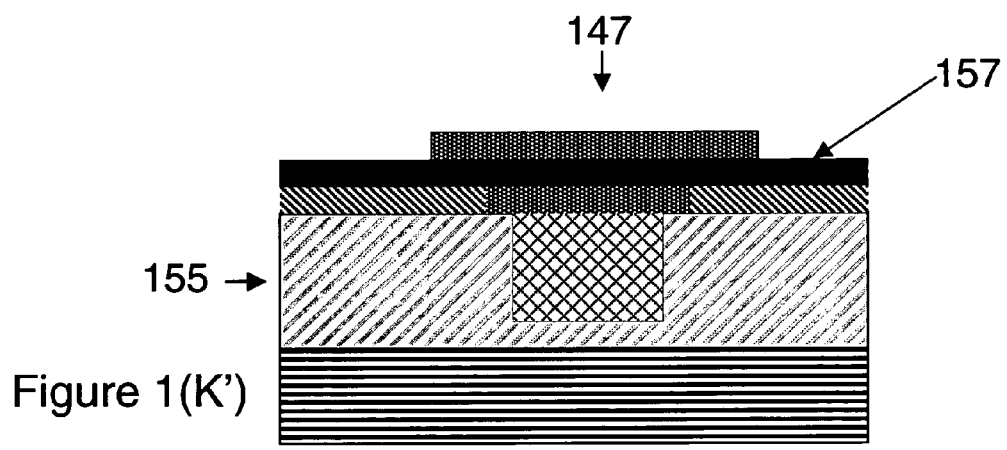
Figure 1(K')

DEVICES HAVING HORIZONTALLY-DISPOSED NANOFABRIC ARTICLES AND METHODS OF MAKING THE SAME

CROSS-REFERENCE TO RELATED APPLICATIONS

This application claims priority under 35 U.S.C. §119(e) to U.S. Provisional Pat. Apl., Ser. No. 60/446,786, filed on Feb. 12, 2003, entitled Electro-Mechanical Switches and Memory Cells Using Vertically-Disposed Nanofabric Articles and Methods of Making the Same and to U.S. Pat. Apl. No. 60/446,783, filed on Feb. 12, 2003, entitled Electro-Mechanical Switches and Memory Cells Using Horizontally-Disposed Nanofabric Articles and Methods of Making the Same, which are incorporated herein by reference in their entirety.

This application is a continuation-in-part and claims priority under 35 U.S.C. §120 to the following applications which are expressly incorporated herein by reference in their entirety:

U.S. patent application Ser. No. 09/915,093 now U.S. Pat. No. 6,919,592, filed on Jul. 25, 2001, entitled Electromechanical Memory Array Using Nanotube Ribbons and Method for Making Same;

U.S. patent application Ser. No. 10/033,323, filed on Dec. 28, 2001 now U.S. Pat. No. 6,911,682, entitled Electromechanical Three-Trace Junction Devices.

U.S. patent application Ser. No. 10/128,118, filed Apr. 23, 2002 now U.S. Pat. No. 6,706,402, entitled Nanotube Films and Articles; and U.S. patent application Ser. No. 10/341,005, filed on Jan. 13, 2003, entitled Methods of Making Carbon Nanotube Films, Layers, Fabrics, Ribbons, Elements and Articles.

TECHNICAL FIELD

The present application relates to devices having horizontally-disposed nanofabric articles and to methods of making the same.

BACKGROUND

Memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY

The present invention provides new devices having horizontally-disposed nanofabric articles and methods of making same.

Under certain aspects of the invention, a discrete electromechanical device includes a structure having an electrically-conductive trace. A defined patch of nanotube fabric is disposed in spaced relation to the trace; and the defined patch of nanotube fabric is electromechanically deflectable between a first and second state. In the first state, the nanotube article is in spaced relation relative to the trace, and in the second state the nanotube article is in contact with the trace. A low resistance signal path is in electrical communication with the defined patch of nanofabric.

Under another aspect of the invention, the structure includes a defined gap into which the electrically conductive trace is disposed. The defined gap has a defined width, and the defined patch of nanotube fabric spans the gap and has a longitudinal extent that is slightly longer than the defined width of the gap.

Under another aspect of the invention, the device includes another electrically conductive trace in spaced relation the patch of nanotube fabric.

Under another aspect of the invention, a clamp is disposed at each of two ends of the nanotube fabric segment and disposed over at least a portion of the nanotube fabric segment substantially at the edges defining the gap.

Under another aspect of the invention, the clamp is made of electrically-conductive material.

Under another aspect of the invention, the clamp is made of electrically-insulative material having a via therethrough filled with electrically conductive material to provide an electrical communication path with the nanotube fabric segment.

Under another aspect of the invention, the nanotube fabric segment is made of a nanofabric having a porosity and wherein the electrically conductive material filling the via also fills at least some of the pores of the of the nanotube fabric segment.

Under another aspect of the invention, the nanotube fabric segment has a lithographically-defined shape.

Under another aspect of the invention, the contact between the nanotube patch and the trace is a non-volatile state.

Under another aspect of the invention, the contact between the nanotube patch and the trace is a volatile state.

Under another aspect of the invention, the at least one electrically conductive trace has an interface material to alter the attractive force between the nanotube fabric segment and the electrically conductive trace.

DETAILED DESCRIPTION

Preferred embodiments of the invention provide new articles having horizontally-disposed nanotube articles and provide methods of making same. Some embodiments provide improved ways of clamping or pinching suspended nanotube articles to improve their performance and manufacturability. Other embodiments provide electromechanical memory cells, which may be discrete or embedded. Under some embodiments, the discrete memory cells use new approaches to connect to other circuitry or cells, which lowers the resistivity of traces to the memory cells. Still other embodiments provide memory cells that have volatile information state (i.e., the information state is lost when power is interrupted). Some other embodiments use three-trace architectures analogous to those of U.S. Patent Application Publication No. 2003-0124325. These embodiments however may utilize a combination of volatile and non-volatile characteristics; for example, information state may be non-volatile, but the device may use a three-trace architecture in which the deflection of the nanotube article may be caused by a trace having volatile state characteristics.

The preferred embodiments are made using nanotube films, layers, or non-woven fabrics so that they form, or may be made to form, various useful patterned components, elements or articles. (Hereinafter "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be employed to utilize the nanofabric articles and devices.

Preferred embodiments of the present invention include articles and methods that increase a strain in the nanofabrics, allowing selectable construction of volatile and non-volatile electromechanical switches, including tri-state or tri-trace switches having both volatile and non-volatile states. The nanofabrics in some embodiments also provide for discrete cellular articles, such as memory cells, to be manufactured.

Briefly, FIGS. 2A-D illustrate discrete devices that have a nanotube article that is suspended relative to two control electrodes. The gap distance between electrode and nanotube article may be controlled during fabrication to result in different behavior of the device. These embodiments, among others, are discussed in more detail below.

FIGS. 3-6 show various plan and cross-section views of a device to illustrate the crossed- and spaced-relationship between the control electrodes and the nanotube article for a given cell or device.

Preferably, the nanotube patch or segment is clamped (above and below) up to the portion of the nanofabric article that is so suspended. In addition, preferably, the nanofabric article is connected or joined to high conductivity signal paths.

Figure 1A:
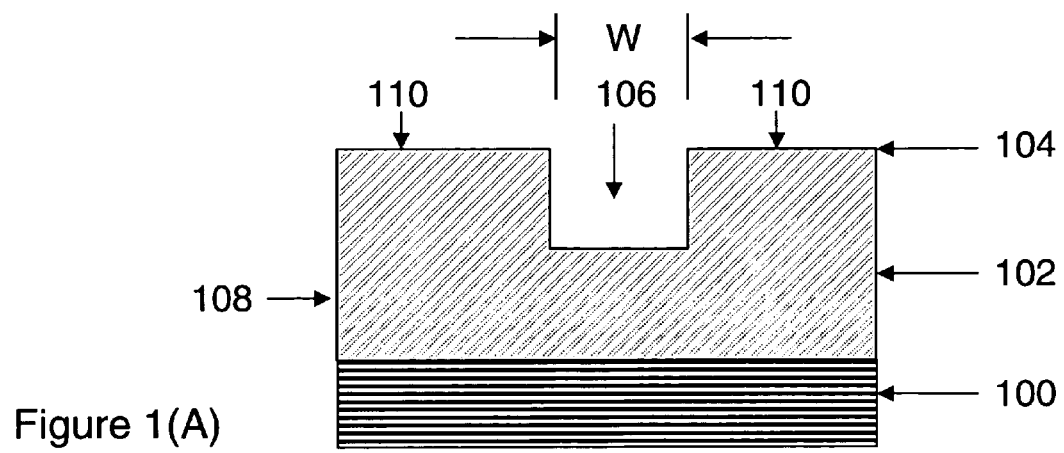
FIGS. 1A-P are cross-sectional diagrams that illustrate intermediate structures created during the process of forming a device having a horizontally disposed nanotube article according to certain embodiments of the invention.
Figure 1B:
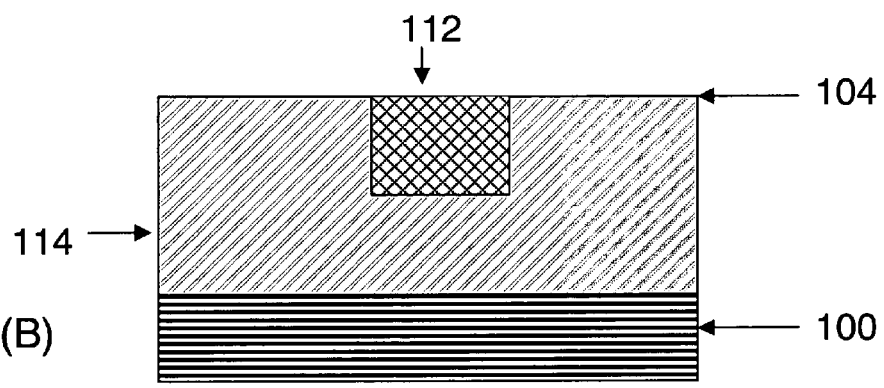
Figure 1C:
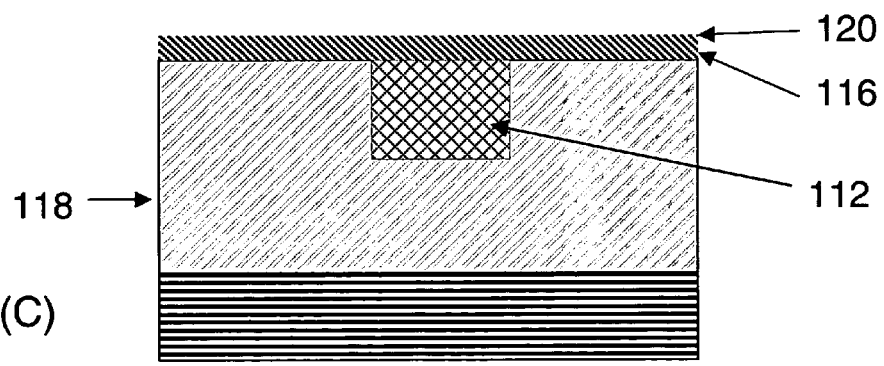
Figure 1D:
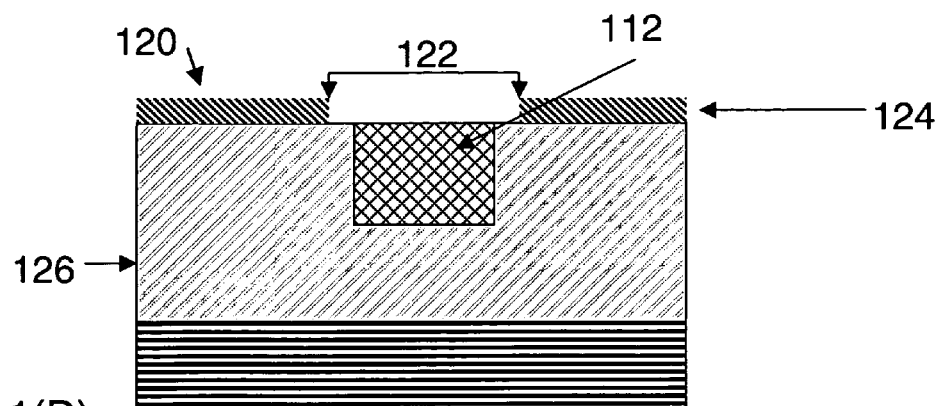
Figure 1E:
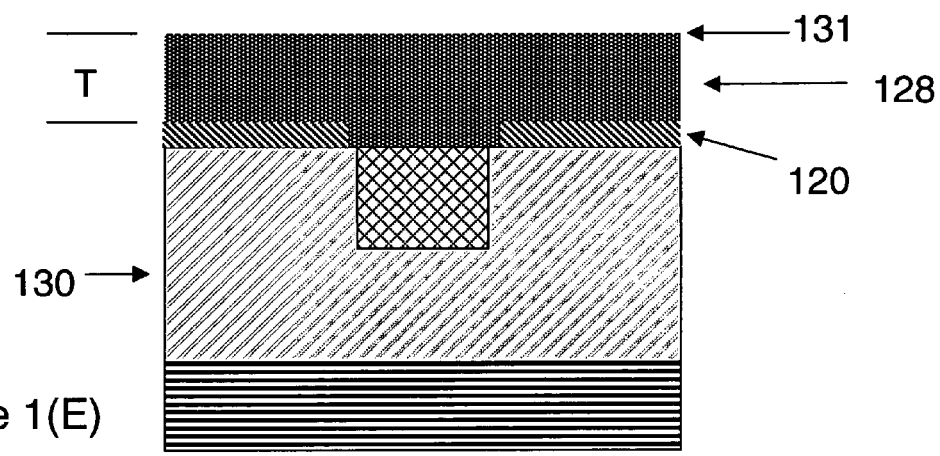
Figure 1F:
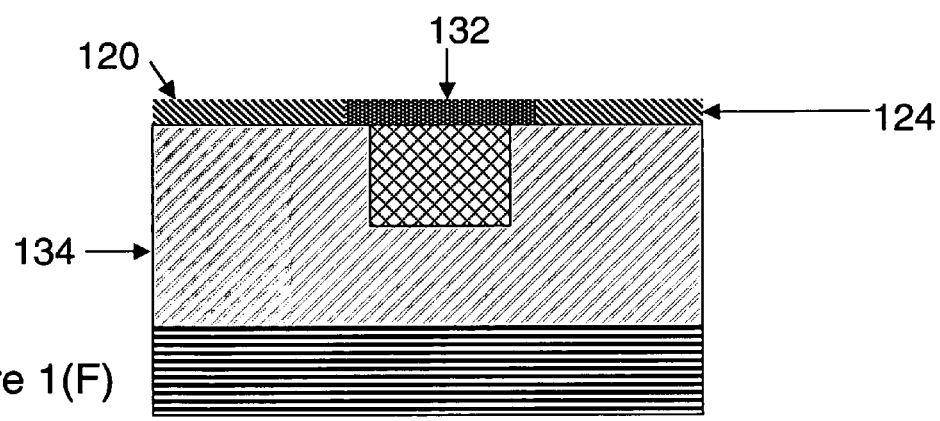
Figure 1G:
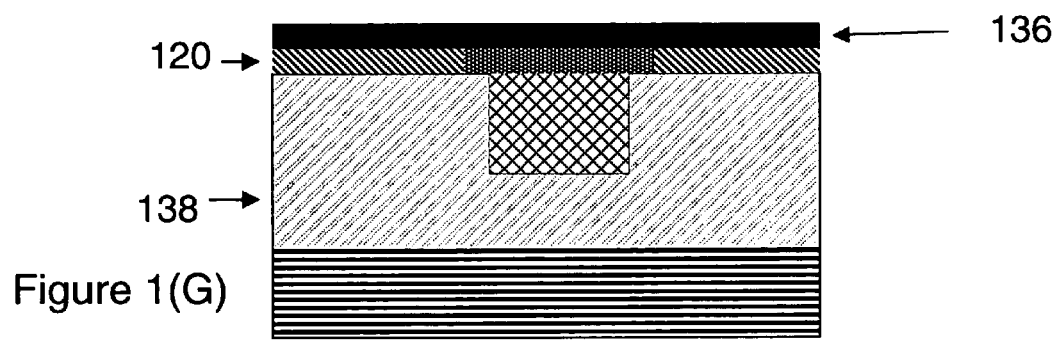
Figure 1H:
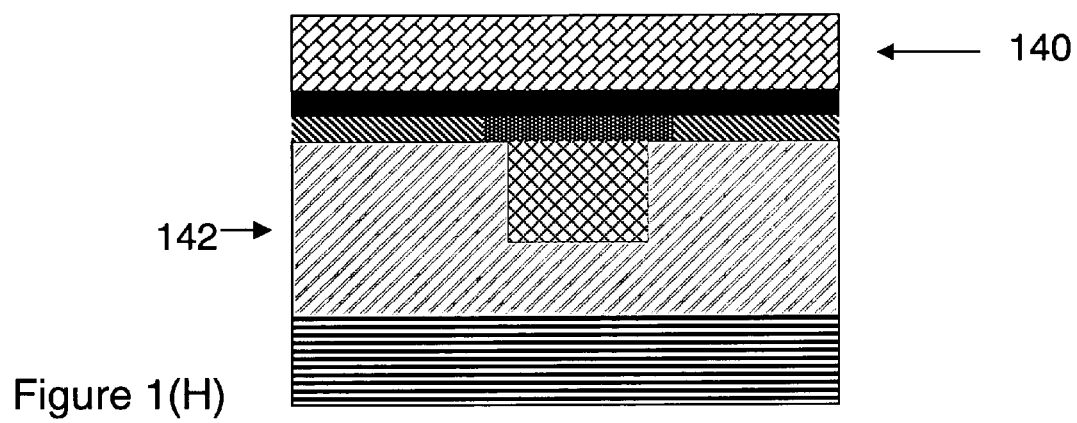
Figure 1I:
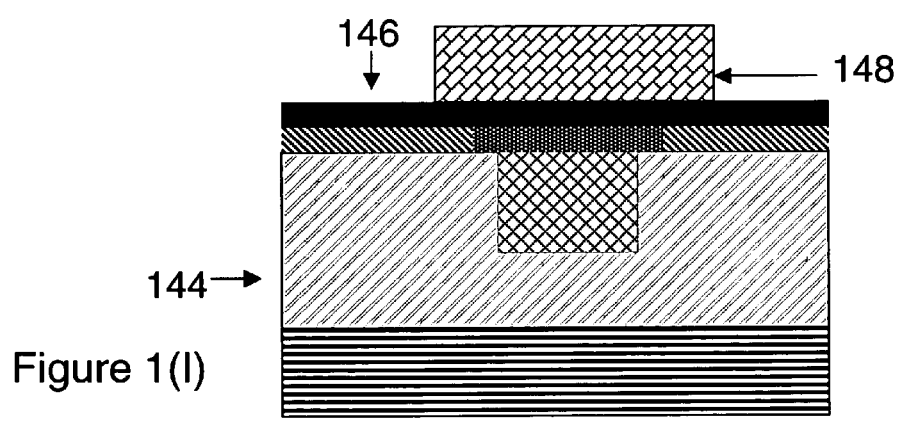
Figure 1J:
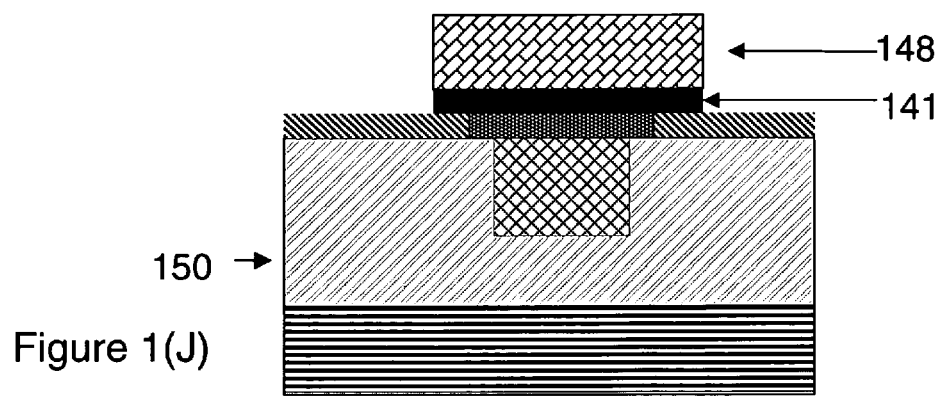
Figure 1K:
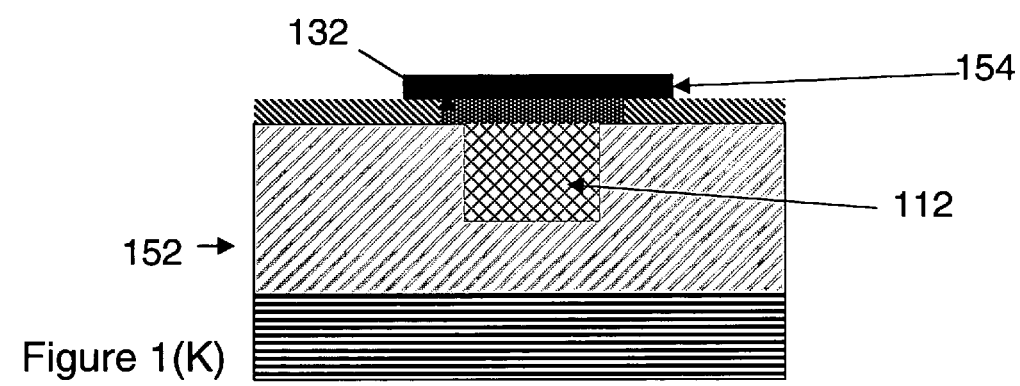
Figure 1L:
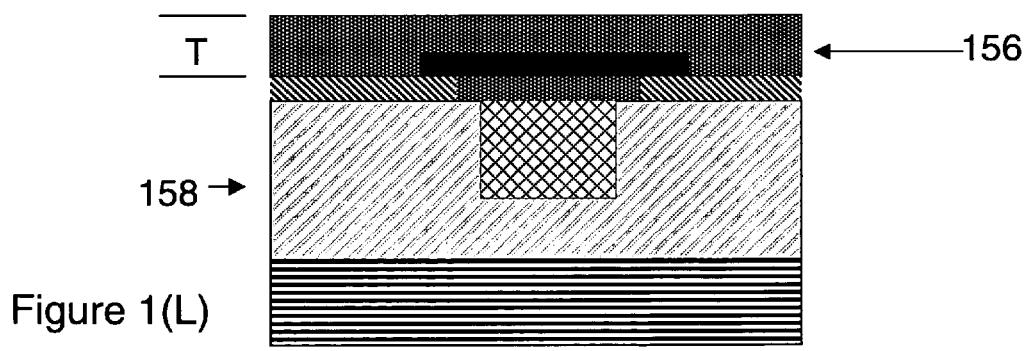
Figure 1M:
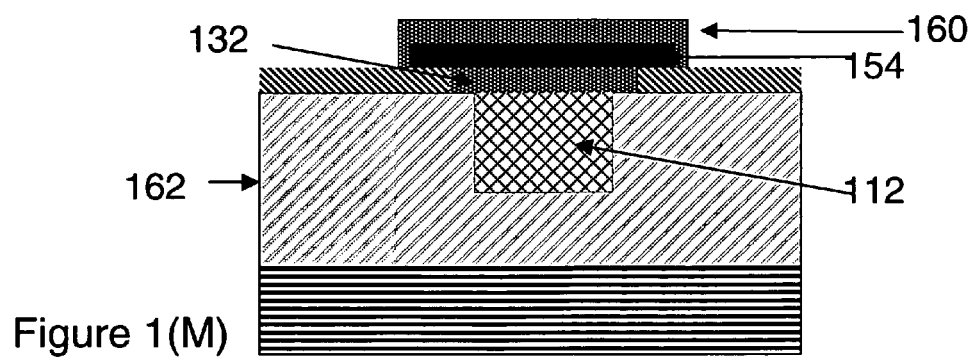
Figure 1N:
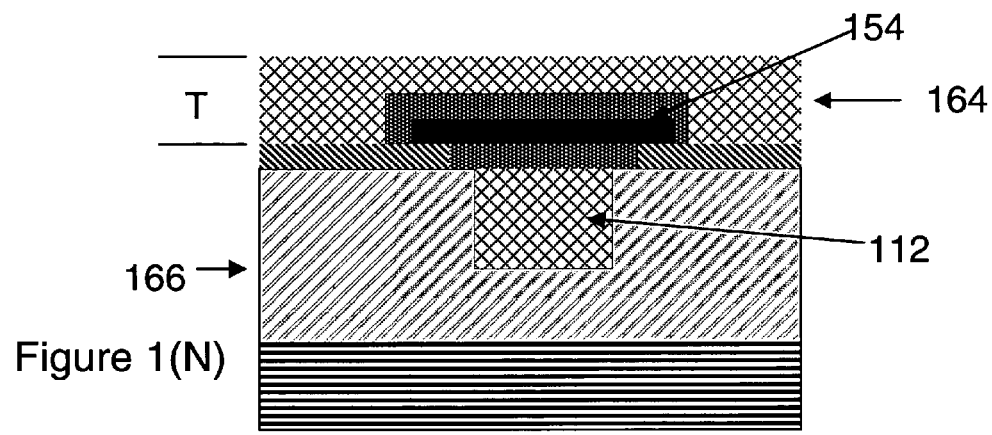
Figure 1O:
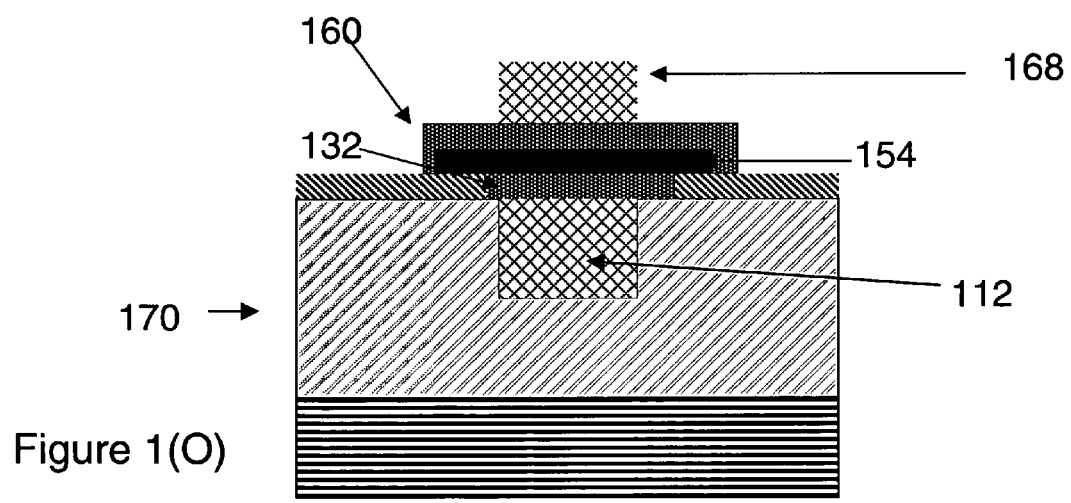
Figure 1P:
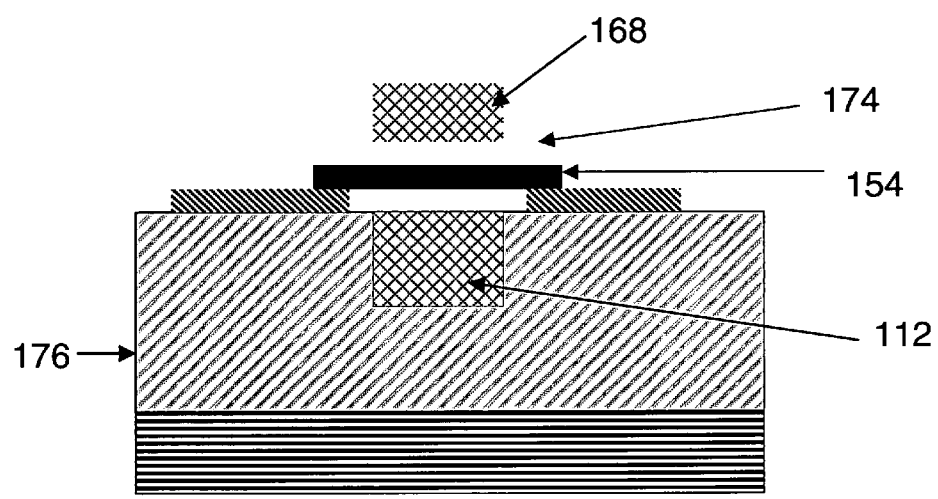

FIGS. 1A-P illustrate how individual, discrete devices or cells having nanofabric articles may be made according to preferred embodiments of the invention. (The figures are not to scale.) The individual cell includes a patch or segment of the nanofabric suspended between two other traces disposed in crossed-relation to the patch or segment.

Referring to FIG. 1A, a silicon wafer substrate 100 with an insulating or oxide layer 102 is provided. (Alternatively, the substrate may be made from any material suitable for use with lithographic etching and electronics, and the oxide layer can be any suitable insulator.) The oxide layer 102 has a top surface 104. The oxide layer 102 is preferably a few nanometers in thickness, but could be as much as 1 μm thick. The oxide layer 102 is patterned and etched to generate cavities 106 to form support structure 108.

The width W of cavity 106 depends upon the type of lithographic patterning used. For example, with present photolithography this cavity may be about 180 nm wide. With other approaches the width may be as narrow as about 20 nm or smaller. The remaining oxide material defines supports 110 on either side of cavity 106.

Referring to FIG. 1B, material is deposited in the cavities 106 to form a lower electrode 112; the electrode material can be chosen from any suitable conductor or semiconductor. The lower electrode 112 is planarized such that its top surface is substantially level with the top surface 104 of oxide layer 102, forming intermediate structure 114. Lower electrode 112 can be a prefabricated contact plug or a via. Also, lower electrode 112 can be deposited or fabricated in other ways, including by forming on the surface of substrate 102.

Referring to FIG. 1C, a nitride layer 116 (or any suitable insulator) is deposited on the surface of structure 114, forming intermediate structure 118. Nitride layer 116 has a top surface 120. A non-limiting example of nitride thickness is approximately 20 nm for 0.18 micron ground rule (GR). The nitride thickness may vary depending on the ground rule of the desired final product. As explained below, these dimensions can affect certain characteristics of the device; for example, in the case of a discrete memory cell the parameters may determine whether the switch is non-volatile or volatile and may affect the $V_{on}$ and $V_{off}$ voltages for causing the nanofabric article to deflect.

Referring to FIG. 1D, nitride layer 116 of structure 118 is then patterned and etched to generate cavities 122. The size and shape of the cavity 122 is made to correspond to what will eventually become nanotube active regions, i.e., the regions in which nanofabric articles may be caused to deflect. The cavity 122 is formed substantially above lower electrode 112, and leaves remaining nitride layer 124 and forms intermediate structure 126.

Referring to FIG. 1E, a sacrificial layer 128 of polysilicon (having top surface 131) is deposited on the surface of intermediate structure 126, forming intermediate structure 130. A non-limiting parameter for the thickness T of polysilicon layer 128 is on the order of 100 to 200 nm.

Referring to FIG. 1F, the top surface 131 of intermediate structure 130 is planarized. By doing so the surface 133 of the remaining polysilicon layer 132 is substantially level with the top surface 120 of remaining nitride layer 124, thus forming intermediate structure 134.

Referring to FIG. 1G, a nanotube fabric 136 is applied to, or formed on, the surface of intermediate structure 134, thus forming intermediate structure 138. Non-limiting methods of applying such a fabric 136 are by spin coating pre-formed nanotubes, aerosol application, dipping or by chemical vapor deposition. Such methods are described in the references listed and incorporated above.

Referring to FIG. 1H, a resist layer 140 is applied to the top surface of intermediate structure 138, forming intermediate structure 142.

A region of the resist layer 140 is then patterned. The region should be over the area designated for the nanotube active region and should be larger than such. The resist layer 140 may be patterned by first lithographically patterning the resist layer 140 forming intermediate structure 144, as shown in FIG. 1I. Structure 144 has exposed portions 146 of nanofabric on either side of patterned resist 148.

Then, as shown in FIG. 1J, exposed nanotube fabric 146 may be etched away, forming intermediate structure 150. A non-limiting method of etching the nanotube fabric is by plasma ashing. Structure 150 has patterned resist 148 with similarly patterned nanofabric portion 141 underneath.

Referring to FIG. 1K, the patterned resist layer 148 is removed, forming intermediate structure 152, having patterned segment or patch 154 of nanotube fabric. The patch 154 is over region 132 of sacrificial material which is over electrode material 112. The patch is slightly longer than the width of the polysilicon region 132.

Referring to FIG. 1L, a polysilicon layer 156 is deposited over the top surface of intermediate structure 152 to form intermediate structure 158. A non-limiting range of polysilicon layer 156 thickness T is between about 20 to 50 nm.

Referring to FIG. 1M, the polysilicon layer 156 is patterned forming intermediate structure 162. Structure 162 has a remaining polysilicon layer portion 160 over the patch of nanotube fabric 154, which as stated above is positioned in what will be a nanotube active region. Polysilicon layer portion 160 is larger than what will be nanotube active region 122 and is the same size or larger than the underlying patterned nanotube fabric 154.

Referring to FIG. 1N, top electrode material 164 is deposited over the top surface of intermediate structure 162, forming intermediate structure 166. A non-limiting thickness T of electrode material 164 is on the order of about 350 nm. The material for use as top electrode 164 can be selected from any metal or conductor suitable for electronic components. Alternatively, depending on the ultimate use of the device fabricated, this material could be an insulator, e.g., if it were to be used as a nanotube protective layer. The top electrode could also be defined as a line or a slot landing pad or other structure suitable for interconnection.

Referring to FIG. 1O, top electrode material 164 is patterned to form upper electrode 168. The top electrode could also be defined as a line or a slot landing pad or other structure suitable for interconnection. FIG. 1O does not show upper encapsulation material for the sake of clarity.

Referring to FIG. 1P, remaining polysilicon layer portion 160 and remaining polysilicon 132 are etched away to create structure 176. The electrodes 168 and 112 extend perpendicularly relative to the page and are supported at ends away from the nanotube active area in which the patch 132 of nanofabric is suspended. The patch 154 is suspended with gaps, e.g., 174, defined by the thicknesses of the sacrificial material that was removed, e.g., 160. FIG. 1P does not show upper encapsulation material for the sake of clarity. FIGS. 2A-D, however, illustrate how upper material 178 is used to encapsulate the structure and to assist in clamping the suspended nanotube fabric article.

The process described above can be modified in many ways. For example, the steps corresponding to FIGS. 1I-L may be substituted as follows. Referring to FIG. 1I' (which would follow steps corresponding to FIG. 1H), resist layer 140 (see FIG. 1H) is patterned to leave photoresist 149 and have exposed nanotube portion 147, forming intermediate structure 145.

Referring to FIG. 1J', a layer 151 of polysilicon is deposited over what was the exposed nanotube region 147 (see FIG. 1I') and onto the remaining photoresist layer 149, forming intermediate structure 153. Polysilicon layer 151 may be any material useful in CMOS processing so long as it is differently etchable over resist layer 140 and the exposed nanotubes.

Then, referring to FIG. 1K' remaining photoresist layer 149 is removed in a liftoff process, forming structure 155 with exposed nanotube fabric portions 157. The process then continues with that mentioned above starting with the description of FIG. 1M.

The exposed nanotube fabric portions 157 may be removed in an ashing process, leaving polysilicon layer 151 over nanotube fabric segment 154, forming structure 162. The remaining polysilicon portion 151 is larger than what will be the nanotube active area, similar to the situation above, and similar subsequent steps may be performed to complete the structure.

Figure 2A:
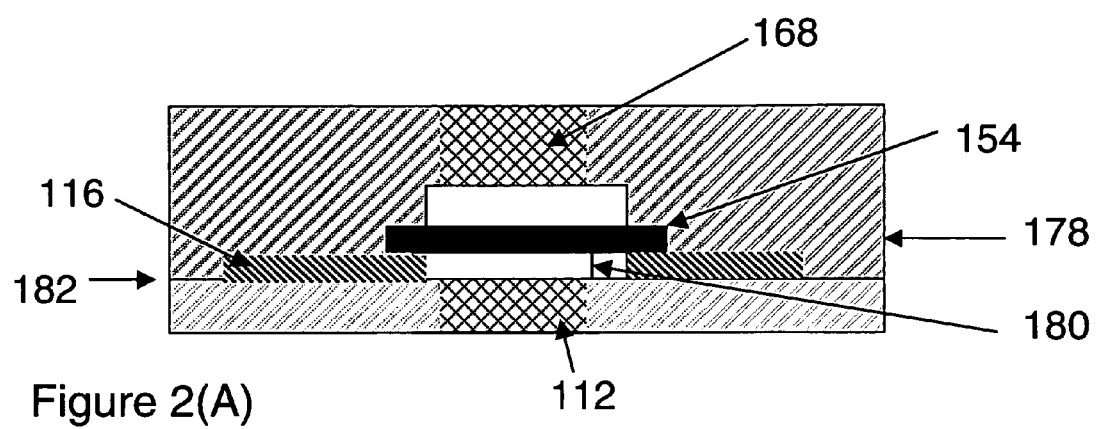
FIGS. 2A-C are cross-sectional diagrams that illustrate certain embodiments of the invention in which the gap displacement between a suspended nanotube article and an electrode may be controlled during fabrication and also illustrate a metallization scheme according to certain embodiments of the invention.
Figure 2B:
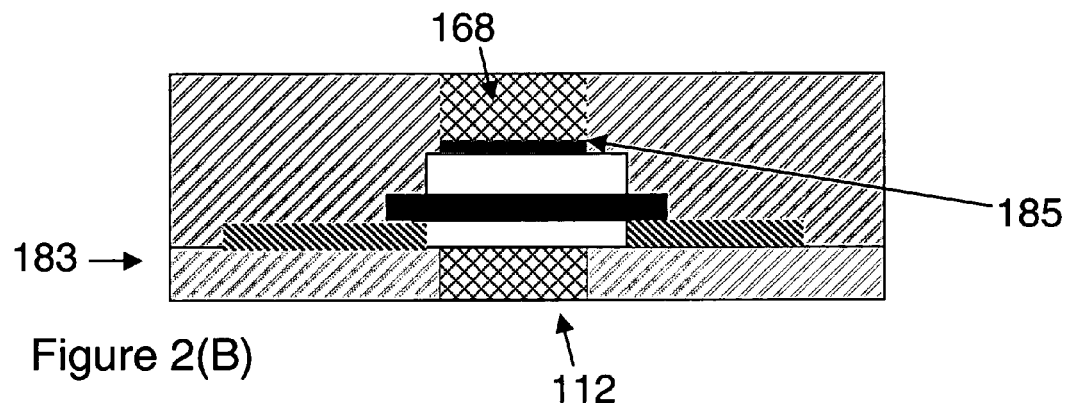
Figure 2C:
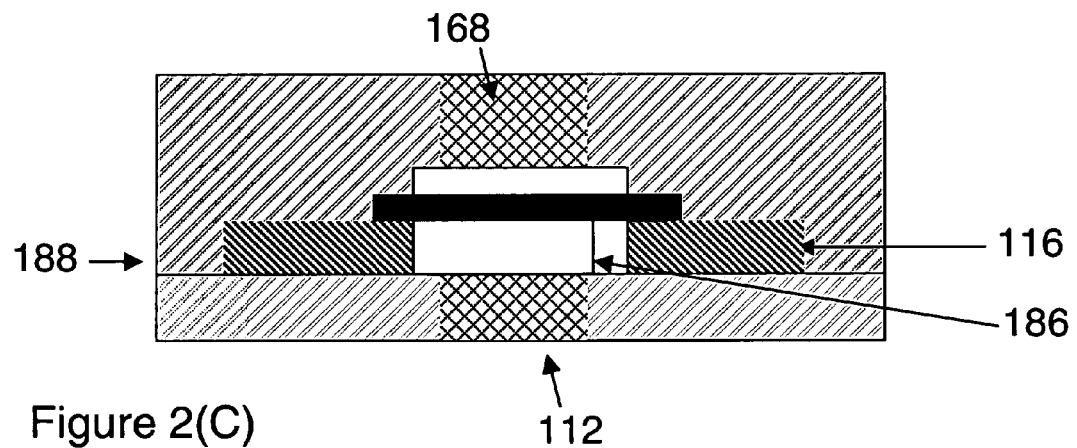

FIGS. 2A-C illustrate a metallization and encapsulation scheme that can be used with structure 176 of FIG. 1P. Specifically, the structure 176 has been encased by insulating material 178. Depending on the techniques employed the region in which the nanofabric article is suspended may be vacuum.

The structure so formed is a tri-stable or tri-trace device. For example, some of the patent applications identified and incorporated above describe various ways in which tri-stable or tri-trace devices may be used. Among other ways, the tri-trace device may be used as a redundant way in which to activate the suspended nanotube article; may be used to encode tertiary information; may be used in a push-pull arrangement with the suspended article. In addition, it may be used so that one trace is used to deflect the nanotube article into contact with an electrode, and the other trace may be used to release the nanotube article from contact.

The nanoswitch in structure 182 has been encased by insulating material 178, and has a gap height 180. In some embodiments, the gap height 180 is a function of the thickness of sacrificial polysilicon layers 132, 160 (see FIG. 1(O) above). Upon deflection, the nanofabric contacts the lower electrode 112 forming a stable van der Waals interaction yielding a non-volatile switch.

Structure 183 illustrates a nanofabric based switch having an insulation layer 185 over one electrode. (Fabrication of such an oxidized electrode is explained below in Example 3.) The insulation layer 185 may be used to change the characteristics of the switch to be volatile or to provide further assurance of desired behavior. The insulating layer (which alternatively may have been placed on the facing surface of electrode 168) may be used to prevent different fibers from the nanofabric element from simultaneously electrically contacting both electrodes (112, 168) during a state transition. Such contact may prevent or hinder switching of the fabric between states.

Compare structures 182 and 183, which may be used as non-volatile switches, to structure 188 which illustrates a volatile switch. In structure 188 the gap height 186 between the nanofabric 172 and the underlying electrode 112 has been increased such that the strain energy of the stretched nanofabric overcomes the van der Waals attraction between the fabric and the electrode. The nanofabric forms part of a closed circuit and returns to its non-deflected, open circuit state. It should be noted that the effect of the van der Waals interaction between nanofabrics and other elements can be affected at their interface(s). The effect may be enhanced or diminished; e.g., the attractive force can be diminished by coating the surface of the electrode with a thin layer of oxide or other suitable materials. A purpose of this diminishing of attractive forces may be to create volatile nanoswitches; such volatile switches may be especially useful in applications such as relays, sensors, transistors, etc.

In the embodiment of FIG. 2A, the electrode or electrodes may be activated relative to the patch 154 to cause the patch 154 to deflect and contact the lower electrode 112. In this case, this forms a stable van der Waals interaction. The deflection of the patch also creates a restoring force to restore the patch to horizontal (non-deflected) state shown in FIG. 2A. This restoring force is a function of, among other things, the geometry of the device, e.g., the distance (180) which the patch 154 is deflected. In this embodiment, the van der Waals force which keeps the patch 154 in contact with the electrode 112 is larger than the restoring force resulting from the geometry of FIG. 21, yielding a non-volatile switch. That is, when power is removed, the van der Waals force that holds the patch 154 in contact with electrode 112 is greater than the restoring force on the patch 112, and thus the patch would remain in a deflected state.

Compare this situation to the structure 188 of FIG. 2C. In FIG. 2C, the gap distance 186 is larger creating a larger restoring force. By appropriate control of the gap distances (via creation of the sacrificial material) this gap may be made large enough to create a restoring force that is greater than the van der Waals force. Consequently, the device of FIG. 2C would be volatile. The patch 154 could be deflected similarly to that described above, but the restoring force would be large enough to cause the patch 154 to return to the horizontal state if power were interrupted. The nanoribbon can deflect via electrostatic attraction but the van der waals force by itself is not sufficient to hold it there. In structure 188 the gap height 186 between the patch 154 and the underlying electrode 112 has been increased such that the strain energy of the stretched nanofabric overcomes the van der Waals attraction between the fabric and the electrode. The nanofabric forms part of a closed circuit and returns to its non-deflected, open circuit state.

Figure 2D:
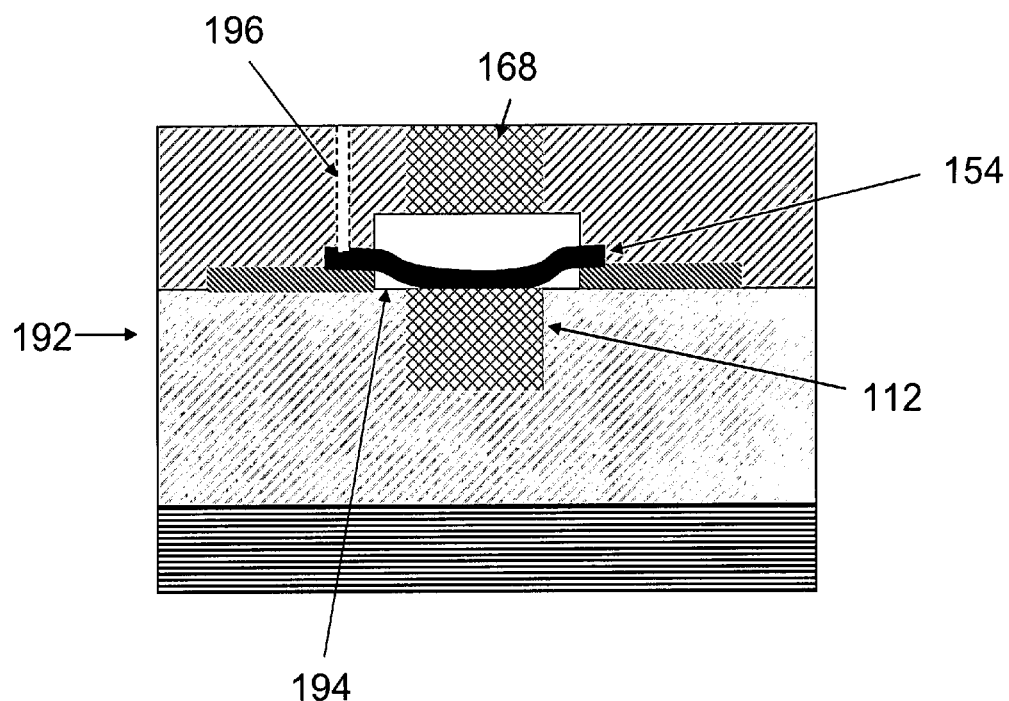

FIG. 2D illustrates structure 192. Structure 192 illustrates a non-volatile switch where deflected nanofabric 154 contacts lower electrode 112 closing a circuit and remains in contact keeping the circuit closed indefinitely. If the gap height 180 of structure 192 were sufficiently large as in structure 188 then the deflected state of the nanofabric 172 would not remain indefinitely.

By properly supporting nanofabric 154, the amount of deformation of the nanofabric 154 can be affected. For example, as shown in FIG. 2(A), the nanofabric 154 may be "pinched" at the edges of the open region 194 left after removal of sacrificial polysilicon layer 132, previously shown in FIG. 1(O). Having upper and lower pinching support around nanofabric 154 can increase the strain on the nanofabric 154. In some embodiments, this type of pinching support at the edges of the open region 194 creates volatile switches which would otherwise be non-volatile. By controlling the design and manufacture of the nano-switch assembly as described here, it is possible to selectably provide tri-state non-volatile structures and/or volatile structures.

Using discrete nanofabrics articles and electrodes in this fashion permits formation of discrete devices and cells. For example, these cells may be used in digital memory devices. The nanofabrics, e.g. 154, and electrodes, e.g. 168, may extend above the substrate and/or supports 102 sufficiently to allow an electrical connection to be made to the nanofabrics 154 and electrodes 168. Such connections may be made by any suitable method, such as by etching or exposure to form a channel 196 (not to scale) or via connecting the nanofabrics 154 with an activation electrical signal.

Channel 196 is used for electrically connecting an element of the switch, e.g. nanofabric 154, to an activation (read/write) line. The channel 196 may subsequently be filled with a conductor to achieve the activation connection, or may be formed by some other technique.

One aspect of the present invention is directed to formation of conductive composite junctions whereby a suitable matrix material is disposed within and around the nanotubes or fibers of a nanofabric or other porous nano material. Such junctions can provide desirable mechanical and/or electrical properties. For example, electrical contact between a nanofabric and a metal connection or activation point may be enhanced, or the contact resistance may be decreased by applying the metal contact as a matrix material impregnating the nanofabric tubes. Also, mechanical contact and strain may be increased as a result of the increased contact between the nanotubes and the matrix material.

For example, with reference to FIG. 2D, activation connection channel 196 extends down to the nanofabric 154. Then a metal filling the channel 196 may further be introduced into the pores of nanofabric 154, in region 194. The matrix material extends down to the underlying nitride layer (or any other layer) below the nanofabric 154. The effect of such a connection can be to secure the nanofabric 154 and increase the strain on the nanofabric 154. Also, the electrical connection between nanofabric 154 and the activation connection is increased. Other methods of securing the nanofabric to the supports are envisioned and one is explained in Example 2, below.

Almost any material (insulating or conducting) can be made to penetrate into or through a porous thin article such as a nanofabric. This may be done to improve the mechanical pinning contact and increase reliability and manufacturability, or to improve electrical connection with the nanofabric and reduce contact resistance to the nanoarticle. Depending on the materials used, a bond may form between the penetrating matrix material and the material below the nanofabric. Examples of materials which can be used to secure a nanofabric in this way include metals and epitaxial silicon crystal materials. Other uses for such junctions are possible, for example in the manufacture of permeable base transistors. It is worth noting that the composite junctions and connections described above do not cause a disruption in the fabric of the nanofabric materials into which the impregnating matrix material is introduced. That is, connection channel 196 does not itself cut through the nanofabric 154, but rather just allows a filler matrix material to flow into and through the nanofabric 154 and connect it to other components of the device. In some cases it may be desirable to use a conductive filler to reduce resistance of the nanofabric or contacts to the nanofabric.

Figure 3:
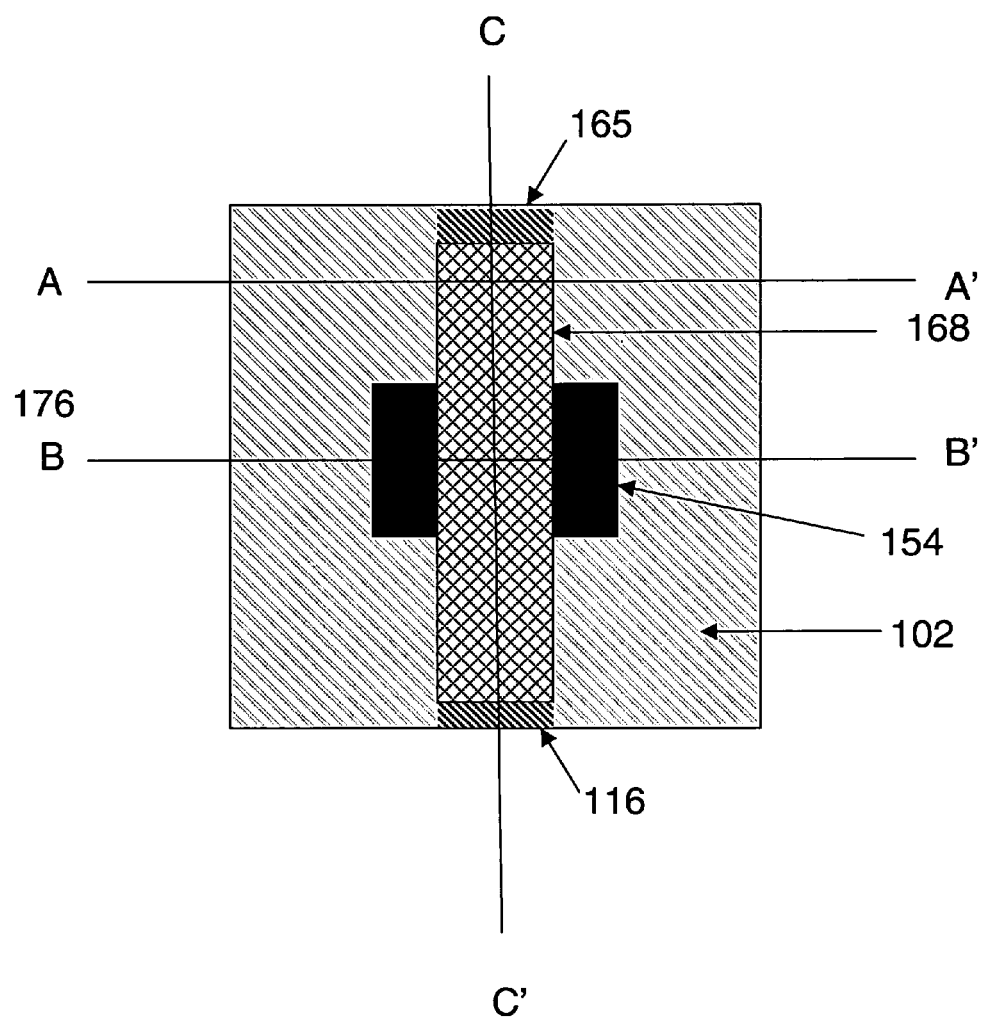
FIG. 3 illustrates a plan view of an intermediate structure according to certain embodiments of the invention.

FIG. 3 illustrates a view of intermediate structure 176 (see FIG. 1P) directly from above. An oxide layer 102 supports a nanofabric 154 and nitride layers 116 support electrode 168. Cross sections A-A', B-B' and C-C' are shown for reference. Upper encapsulation material 178 (see FIG. 2A) is omitted for clarity.

Figure 4:
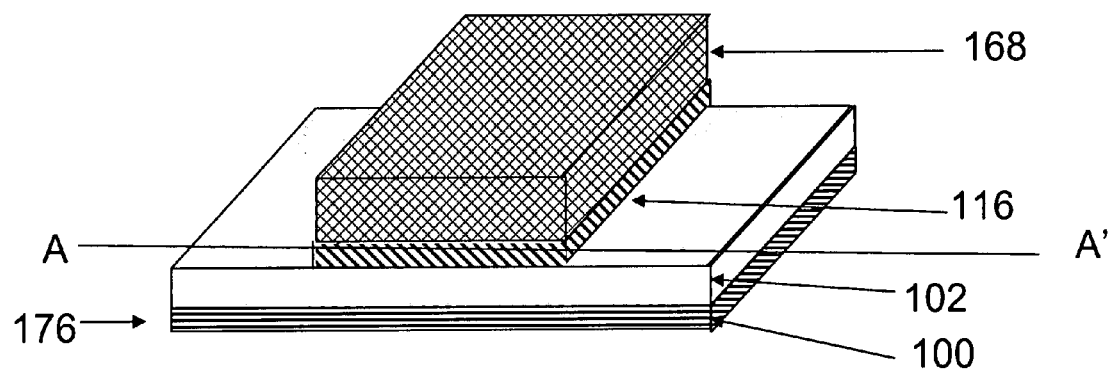
FIGS. 4-6 are perspective views of an intermediate structure shown in various cross sectional views according to certain embodiments of the invention.

FIG. 4 is a perspective view of intermediate structure 176 taken at cross section A-A' shown in FIG. 3. FIGS. 5 and 6 perspective views of intermediate structure 182 taken at cross sections B-B' and C-C' (structure 176 is structure 182 with the top insulating layers removed for clarity). (In FIGS. 4-6 upper material 178 is shown.)

FIG. 4 is an illustration of the elements of the device of FIG. 3, as viewed along cross section at A-A'. (Again encapsulating material 178 is removed from the figure for clarity.). At this portion of the structure, which is away from the nanotube active region, the upper electrode 168 is disposed on top of nitride layer 116.

Figure 5A:
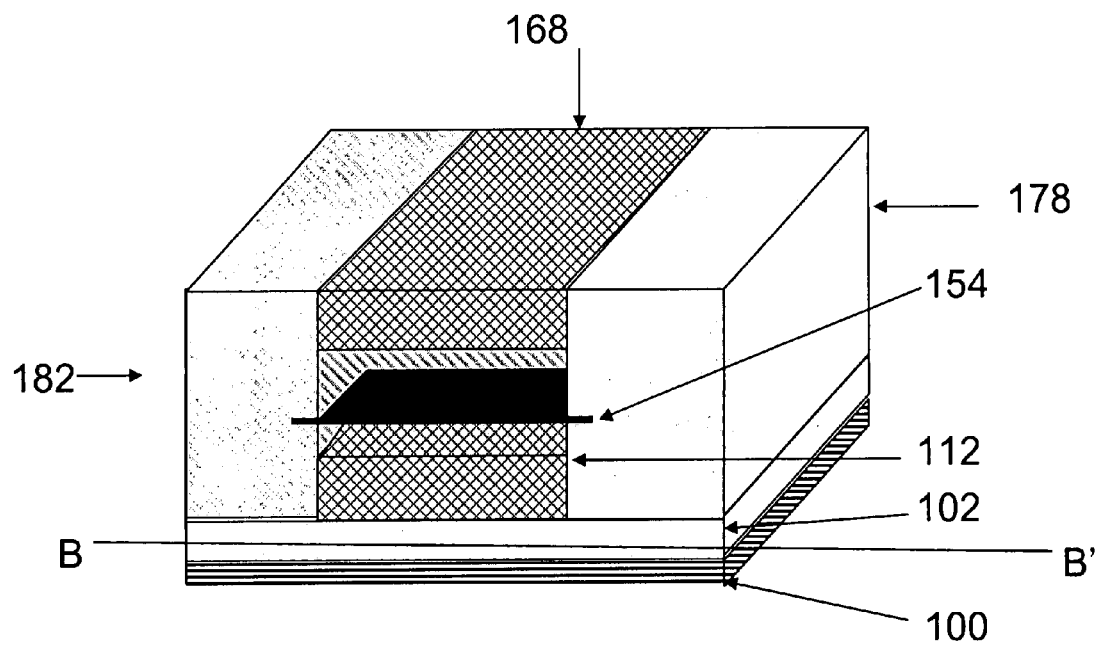
Figure 5B:
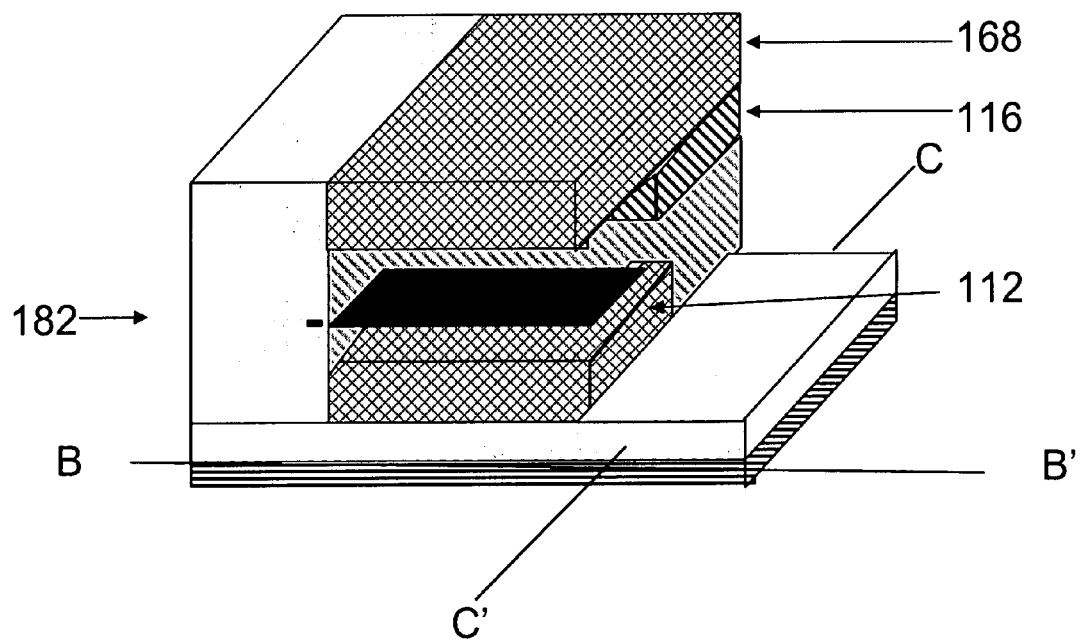
Figure 6:
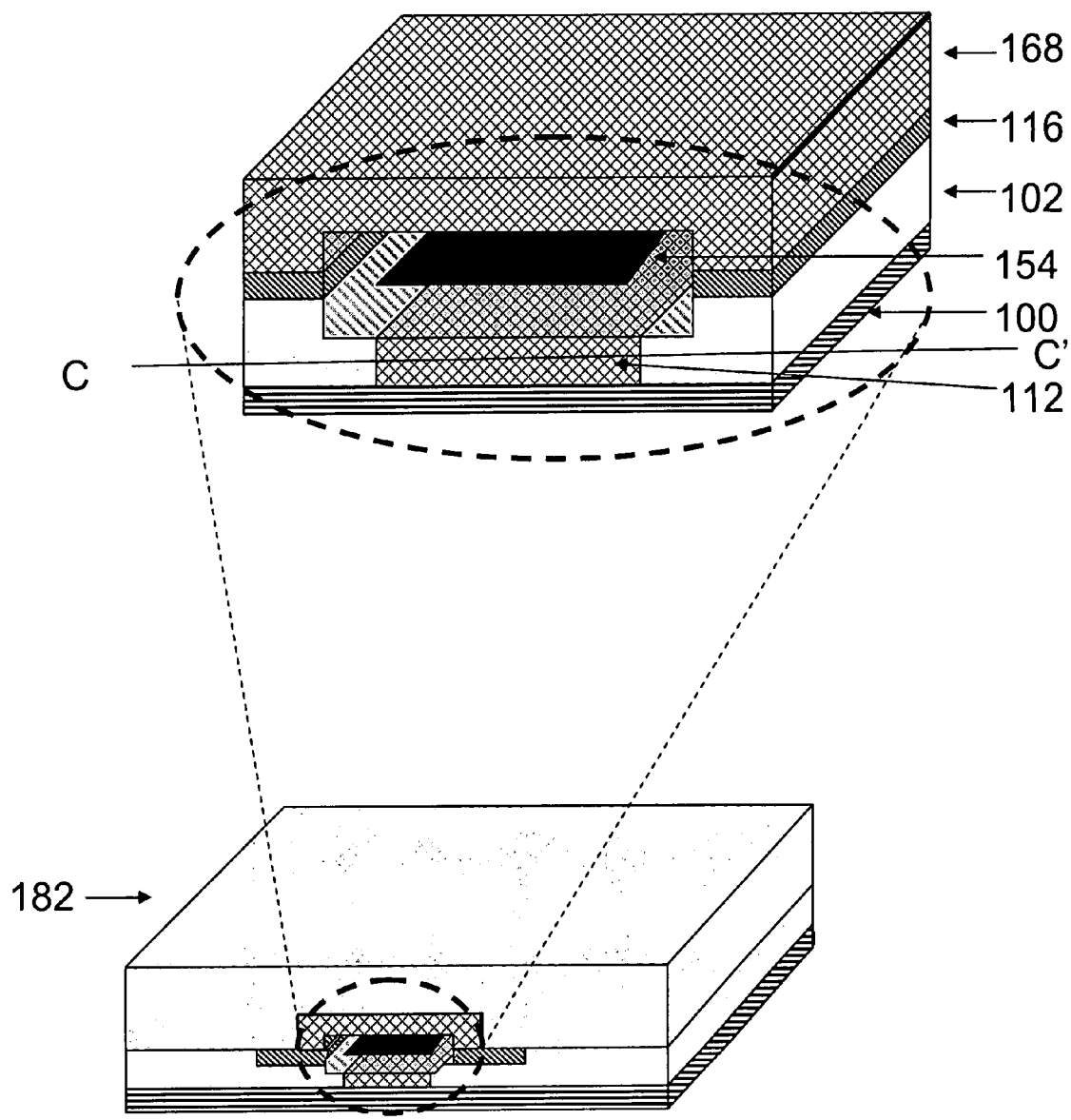

FIGS. 5(A)-(B) illustrate two views of the structure as viewed along cross-section B-B'. In these instances the structure 182 includes the encapsulating material 178 and corresponds to the view of FIGS. 2A-B. FIG. 5A shows the view along cross section B-B', and FIG. 5B shows the view along cross-section B-B' and again in cross section along C-C'.

These views show the patch 154 suspended in an active region between an upper electrode 168 and lower electrode 112. As stated above, and explained in the identified and incorporated patent applications, the electrodes may be used to cause the patch 154 to deflect up or down. The patch 154 is clamped by material from above and below to the edge of the nanotube active region, where the patch is suspended 154 and may be caused to deflect as shown in FIG. 2C. In this embodiment, the displacement D of FIG. 2C has been substantially removed. A substrate layer 100 supports an oxide layer 102. A lower electrode 112 is disposed below and not in contact with nanofabric 154 which is fixed to insulating layer 178 and insulating layer 116 supports electrode material 168. For the sake of clarity, the patch 154 is not illustrated with an electrical contact, but metalization techniques such as those described in connection with FIG. 2C may be employed. As stated above, the gaps between the patch 154 and corresponding electrode may be controlled to create either volatile or non-volatile states.

FIG. 6 illustrates the elements of structure 182 as viewed along cross section C-C'. The patch 154 in this cross section does not appear to be contacting any other element, but as can be seen in FIGS. 5A-B, the patch is contacting and clamped by other elements, e.g. insulating layer 178 (not shown in FIG. 6). The exploded view (shown within the dotted lines) illustrates the interrelations of substrate 100, insulating layer 102, nitride layer 116 and electrodes 112 and 168, as well as the location of patch 158 in reference to the aforementioned elements.

The structures depicted above may be used as nanoelectromechanical switches and can be created to have a volatile or nonvolatile state (as manifested by the deflected state of patch 154) depending on the aspect ratio of the lengths a and b, were a is the distance between the undeflected nanofabric and the electrode (i.e., the gaps 180 or 186 of FIGS. 2A-B), and b is the length of the nanofabric which deflects. If the strain energy of the deflected nanofabric is less than the van der Waals force holding the nanofabric in contact with the lower electrode, then the switch will be non-volatile. If however the strain energy can overcome the van der Waals attraction, then the switch will behave in a volatile manner and a circuit will be closed only fleetingly.

Furthermore, the switch may be volatile with regard to top electrode 168 and non-volatile with regard to lower electrode 112, or both volatile or both non-volatile.

Figure 7:
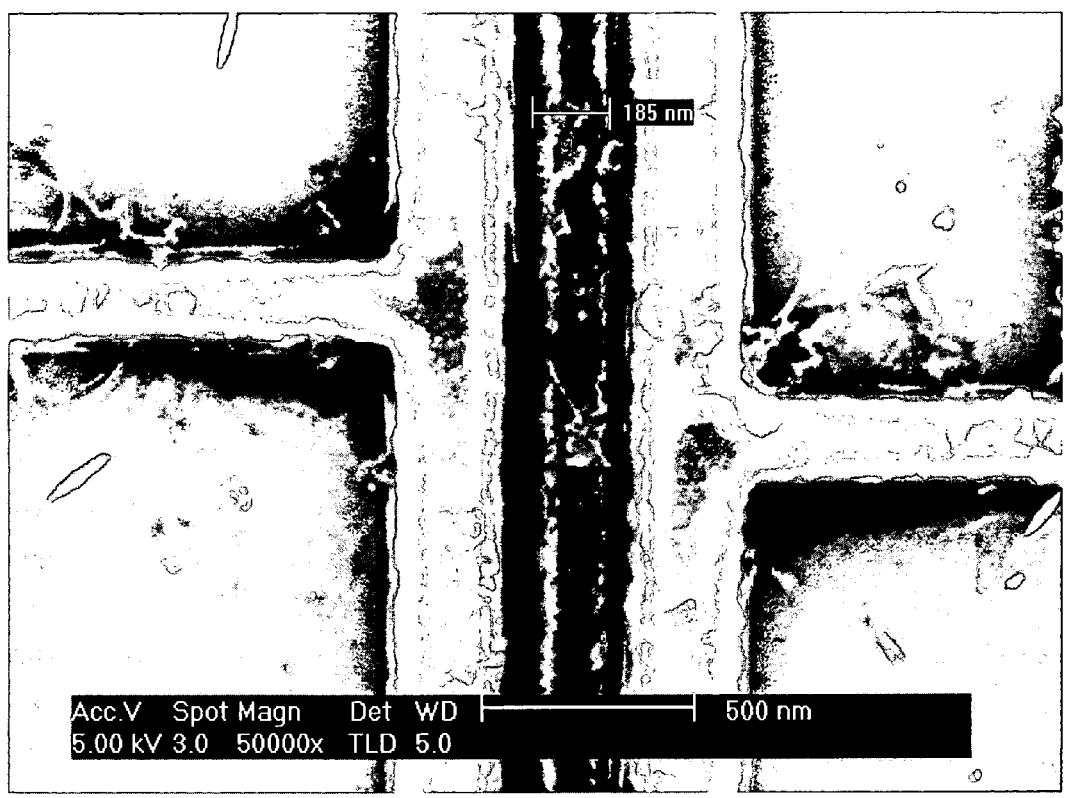
FIG. 7 is a micrograph of an intermediate structure according to certain embodiments of the invention.

FIG. 7 is an actual micrograph of a working nano-fabric-based switch. The fabrication of the switch is described in Example 2, below. In this micrograph, only a few nanotubes of a given patch appear in focus but can be seen spanning the channel formed. (The device omits an upper encapsulating material 178, as shown in FIG. 2A.)

EXAMPLE 1

To fabricate the nonvolatile nanotube switch a silicon wafer with a thermally grown oxide (0.5 μm) is employed.

Embedded electrodes are constructed by electron beam lithography (EBL) with polymethylmethacrylate (PMMA) as resist. After the electrode pattern is defined in the resist, Reactive Ion Etching (RIE) is employed with $CHF_3$ gas to construct a trench in the oxide. The embedded electrodes are constructed by a lift-off process by depositing the electrode in an electron beam evaporator to fill the trench and then stripping of the resist in N-methyl pyrolidone at 70° C. (Shipley 1165). The electrodes are 0.18±0.02 μm wide and consist of 850 Å of metal (Titanium, Ti) and 200 Å of a sacrificial material (Aluminum oxide, $Al_2O_3$). The vertical gap between electrodes and the as yet deposited SWNTs was adjusted at 200±50 Å to yield electromechanically switchable bits as predicted theoretically. This gap of 200±50 Å corresponds to a tensile strain of $\epsilon_{tensile}$=0.9±0.5% of the nanotubes in the ON state, which lies well within the elastic limit of SWNTs. A silicon or metal beam, however, could not withstand this tensile strain without permanent, plastic deformation.

After the creation of the embedded electrodes, the carbon nanotube fabric is constructed. The nanotube fabric is produced by spin-coating a solution of SWNTs in 1,2 dichlorobenze (ortho-dichlorobenzene, ODCB) on the device wafer. The concentration of the nanotube solution is 30±3 mg/L. The solution is sonicated in an ultra-sonic bath (70 W sonication power) for 90 minutes to fully disperse the nanotubes. After sonication, the nanotube solution is spun onto the wafer utilizing typical photoresist spinning techniques. Multiple spins were required to produce the desired sheet resistance of the SWNT fabric of <100 kΩ/square. The sheet resistance of the nanotube monolayer can be reliably varied between 10 kΩ/square and several MΩ/square by adjusting the concentration of the nanotube solution and the number of spin-coating steps. For the devices discussed here, a SWNT sheet resistance of 75 kΩ/square was chosen.

Once the desired nanotube fabric sheet resistance and density is obtained, positive i-line photoresist is spin-coated on the SWNTs (e.g. Shipley 1805 resist). The patterning of the nanotubes, however, is not limited by the type of photoresist employed, since various types of resist have been used. The photoresist-coated wafer is then exposed and developed to form the desired pattern. After development of the pattern, the exposed carbon nanotubes can be removed cleanly by isotropic ashing in oxygen plasma while the nanotubes underneath the photoresist are protected from oxidation. Typically an isotropic oxygen plasma of 300 W power was used for removing the exposed SWNTs at a pressure of 270 mtorr and an ashing time of 9 minutes. The photoresist is then subsequently stripped in N-methylpyrollidinone (NMP) and a SWNT film pattern is exposed. Patterned SWNT stripes were typically 100 μm long and 3 μm wide, although stripes with widths as small 0.25 μm have also been fabricated.

In a subsequent, aligned EBL step, clamp lines (Ti, 1000 Å thick, 0.18±0.02 μm wide) are defined by liftoff in PMMA resist on top of the SWNT stripes, parallel to the embedded electrodes (distance of 1000 Å to electrode). These clamps are necessary to prevent uncontrolled adhesion of the SWNTs to the lower electrode upon removal of the sacrificial layer in the next step. Subsequently, the device electrodes and SWNT stripes were interconnected to bond pads so that individual junctions on a die could be electrically tested. The distance between SWNT stripe metallization and switching junction is 3 μm. Finally, the patterned SWNTs were suspended by wet chemical removal of the $Al_2O_3$ sacrificial layer in an aqueous base (ammonium hydroxide, $NH_4OH$), followed by rinse in deionized water (DI) and isopropanol (IPA). Subsequently, the device die were hermetically packaged.

Programmable nanotube memory devices fabricated according to this procedure were programmed by sweeping the voltage over the junction using the programmable voltage source of a Keithley Electrometer. Simultaneously, the current that flew over the junction was measured using the integrated current preamplifier (10 fA sensitivity) of the electrometer to generate current vs. voltage curves (I-V curves). For all measurements the SWNTs were biased high, while the underlying electrode was held at ground. Current vs. voltage (I-V) measurements showed an abrupt increase in current over the nanotube-electrode junctions at a threshold voltage of 2.5±0.5 V as the SWNTs switched from a suspended, high resistance (>MΩ) OFF state into contact with the underlying electrodes to form an ohmic (~kΩ) ON state. The nanotube bit state was retained even when power was disconnected for several days (i.e., the switched bits are nonvolatile).

EXAMPLE 2

A wafer (32-04, Die E4, Device 9x26/4x17) is coated in resist and patterned with standard optical lithographic technique, the pattern was transferred to the $SiO_2$ by reactive ion etch (RIE) in $CHF_3$ for 4 minutes.

A Cr/Au 5/50 nm marker was used for EBL alignment (via thermal evaporation). The resist and the metal above the resist were removed by a standard liftoff in N-N Dimthyl pyrolidone (1165). The wafer was ashed in $O_2$ plasma for 5 min PMMA. (Microchem), was applied by spin coating 60 seconds at 4000 rpm.

Electron bean lithography (EBL) was performed to make EBL markers, PMMA was developed and the pattern was etched into the SiO2 in $CHF_3$ for 4 min. 5/50 nm Cr/Au was deposited, and a liftoff was performed as above to leave the EBL markers. PMMA was applied, and EBL was performed to create the lower electrode pattern. The PMMA was developed with MIBK. RIE was performed in CHF3 for 4:30 minutes to transfer the pattern to the $SiO_2$.

85/20 nm Ti (conductor)/$Al_2O_3$ (sacrificial layer) was Electron Beam deposited, and lifted off as described above to create the lower electrodes.

Atomic Force Microscopy (AFM) was performed to determine the under/overfill of the lower electrode, the electrodes were underfilled by −2 nm).

Laser ablation-grown nanotubes in solution were spun on to the wafer, 8 times to produce a film with a 50 KiloOhm resistance (500 rpm for 30 sec. and 2000 rpm for 20 seconds, 8 times).

Photoresist was spun onto the nanotube fabric (1 Min 400 rpm). The resist was patterned and developed and the wafer was ashed in an $O_2$ plasma for 3 min at 300 W three times, with 5 minute intervals to remove the exposed nanotubes. The remaining resist was removed in 1165 (Shipley). PMMA was applied as above, and EB lithography was performed to create a pattern of clamps which attach the nanotube fabric more securely to the underlying supports, (100 nm Ti). Interconnects (not shown in the micrograph) are created by first applying and developing resist as above, and upper interconnect metal material (10/10/250/10 Cr/Au/Cu/Au) was deposited and a lift off procedure was performed. The sacrificial $Al_2O_3$ layer was removed by wet etch in 4:1 Deionized water:351 (Shipley) (an NaOH based developer). The junction shown in FIG. 7 was created by the method outlined in Example 2. The light vertical stripes are raised supports; the single dark stripe is a lower electrode below suspended nanotubes. Because of the resolution of the electron microscope, the image does not clearly show the nanotubes, it does, however show the geometry of the switch.

EXAMPLE 3

A junction created as described in Example 2 was oxidized in order to increase the reliably volatile aspect of switches as follows:

Five standard cubic centimeters per minute (sccm) of $O_2$ was flowed over an NRAM switch, ac voltage (triangle wave) was applied to the NRAM junction (5 V amplitude, 10 kHz frequency).

Amplitudes lower than 2 V are not high enough to make the switch volatile. Amplitudes higher than 7 V frequently destroy the device (very high to infinite resistance afterwards). It was found that the switch turns volatile within a few seconds of application of voltage in the presence of the $O_2$, after which, the switch remained volatile. 5V amplitude of ac wave adequately oxidizes the electrode; however voltage amplitudes of 2 V-7 V have been successfully used for fabricating volatile devices.

Figure 8A:
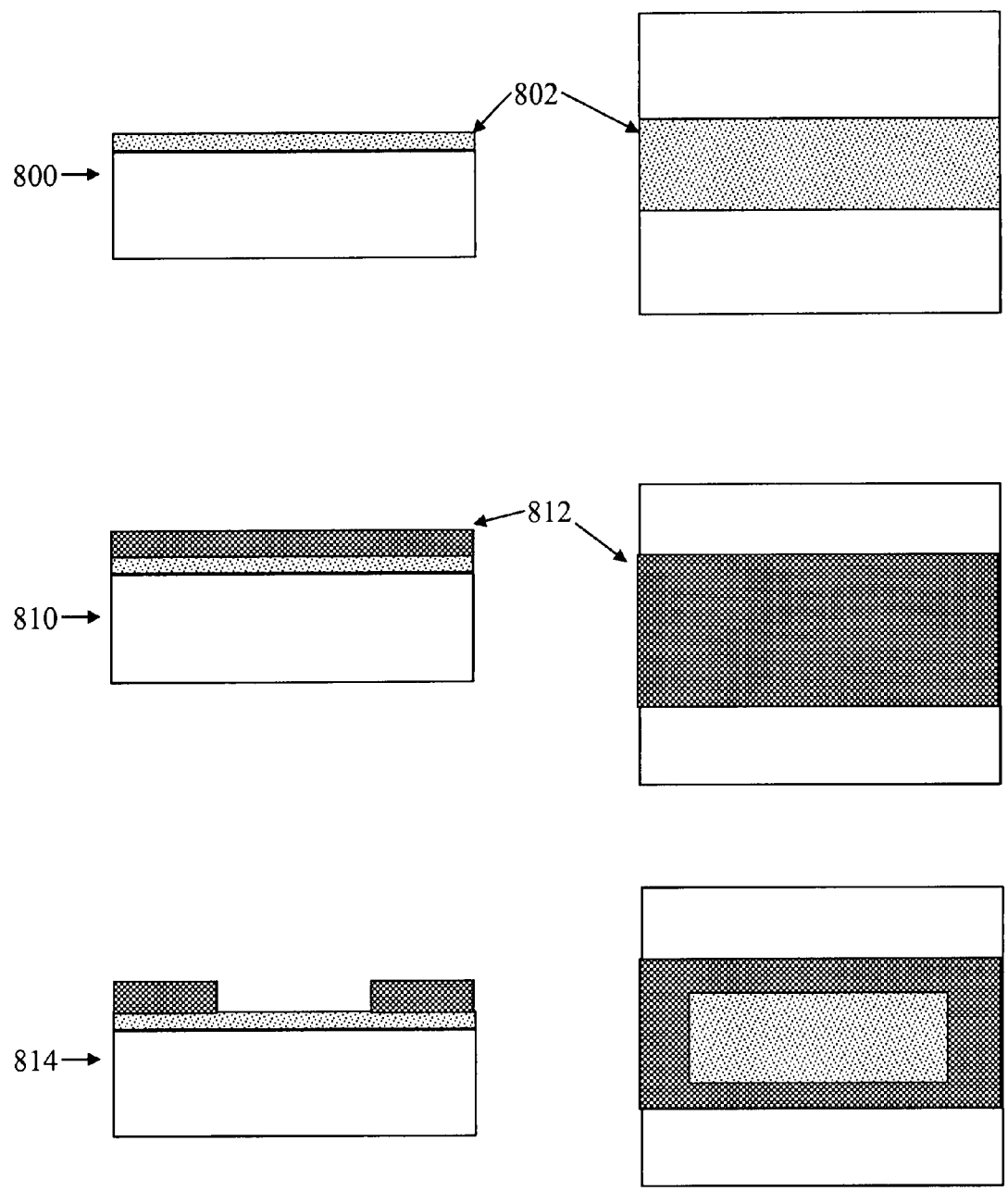
FIGS. 8A-B and 9 illustrate ways to strap or clamp articles made from layers of matted nanotubes with materials, including relatively low resistance materials, according to certain embodiments of the invention.
Figure 8B:
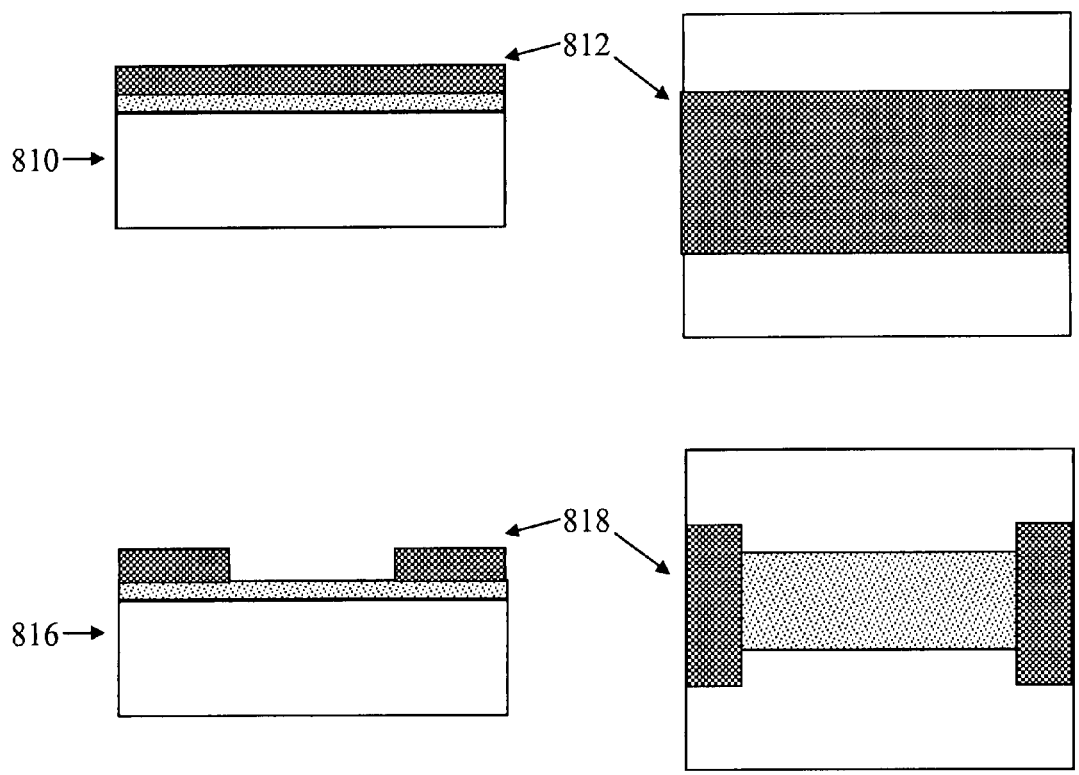
Figure 9:
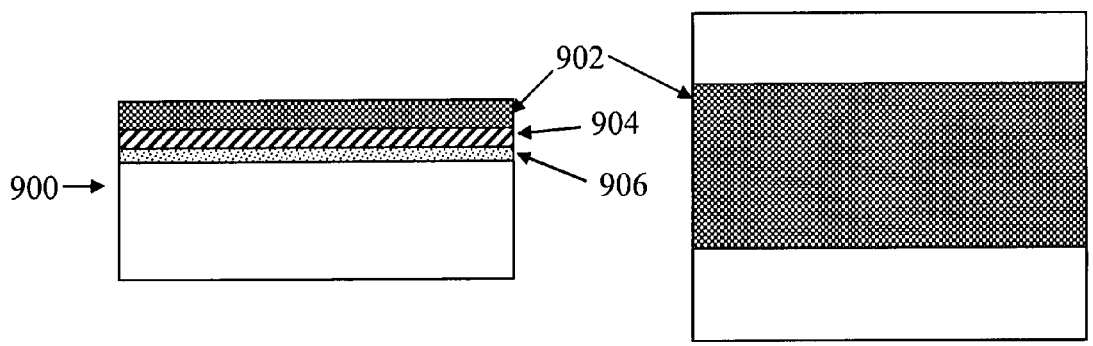
Figure 9:
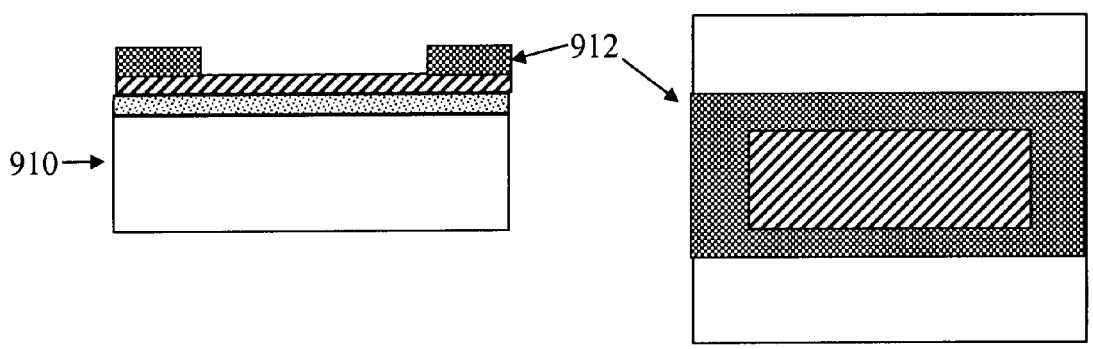
Figure 9:
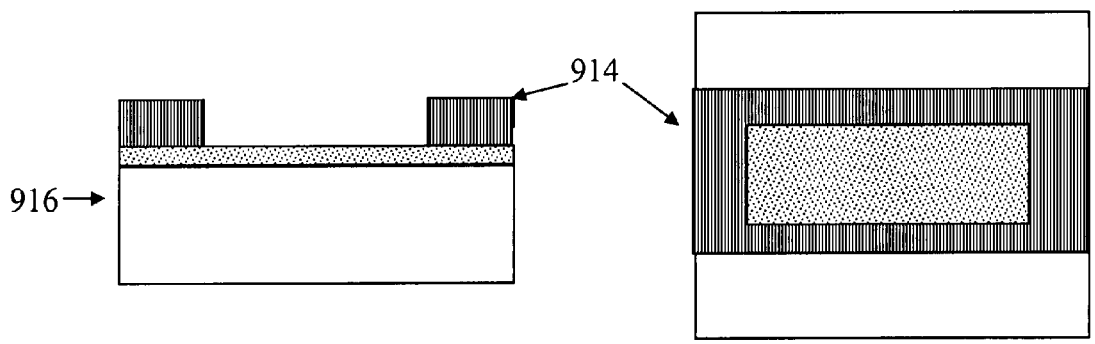

FIGS. 8A-9 illustrate various ways in which a nanotube fabric may be clamped or pinched or strapped by various materials including metal coverings. This may be done to better hold the nanotube patch and to provide low resistance interconnect to the patch.

FIG. 8(A) illustrates a framed portion of nanofabric and a method of its creation. Such a framed nanofabric may be created by first creating a fabric 802 on a substrate, as illustrated by intermediate structure 800, covering the fabric 802 with an appropriate covering material 812, as shown illustrated by intermediate structure 810, and patterning and removing a section of the covering material 812, e.g. by lithography leaving a "frame" of material around exposed fabric, as shown in intermediate structure 814. Such a strapping method is more fully described in "Non-volatile Electromechanical Field Effect Transistors and Methods of Forming Same" US Provisional Patent Application, filed Jun. 9, 2003, Ser. No. 60/476,976. The covering material may be conductive, and may act to alter the electrical properties of the entire patterned fabric, or it may be semiconducting or insulating. The material of the strapping layer should be selectively etchable over nanofabric when used alone to open up a window of exposed fabric. The material of the covering layer may be selectively etchable over an intermediate layer disposed between the nanofabric and covering layer. The intermediate layer in this case may act as an etch stop when etching and patterning the covering layer.

FIG. 8(B) illustrates a patterned fabric where no frame is formed, rather a set of disconnected sections of covering layer are formed, disconnected sections may be electrodes and have particularly useful application for resistance modulation detection structures. Intermediate structure 810 is patterned to form electrodes 818, as illustrated in intermediate structure 816.

FIG. 9, intermediate structure 900, illustrates yet another method of forming nanofabric-based devices. Such a method involves a covering material 902 that is selectively etchable over an intermediate layer 904. Covering material 902 is preferably metal, and intermediate layer is preferably a semiconductor, e.g. silicon, however any suitable material for the application will work. The intermediate layer 904 is disposed between the nanofabric 906 and covering layer 902. The intermediate layer 904 in this case may act as an etch stop when dry etching and patterning the covering layer 902. Intermediate structure 910 illustrates patterned covering layer 912 in the shape of a frame, however any pattern will work depending on the requirements of the final product. Intermediate structure 910 is subjected to an annealing step (forming structure 916) whereby covering layer 902 and intermediate layer form a conducting composite layer 914, e.g. a metal silicide. Such a composite layer can act as stitching electrode or other contact or addressing element, depending on the use of the final product.

Figure 10:
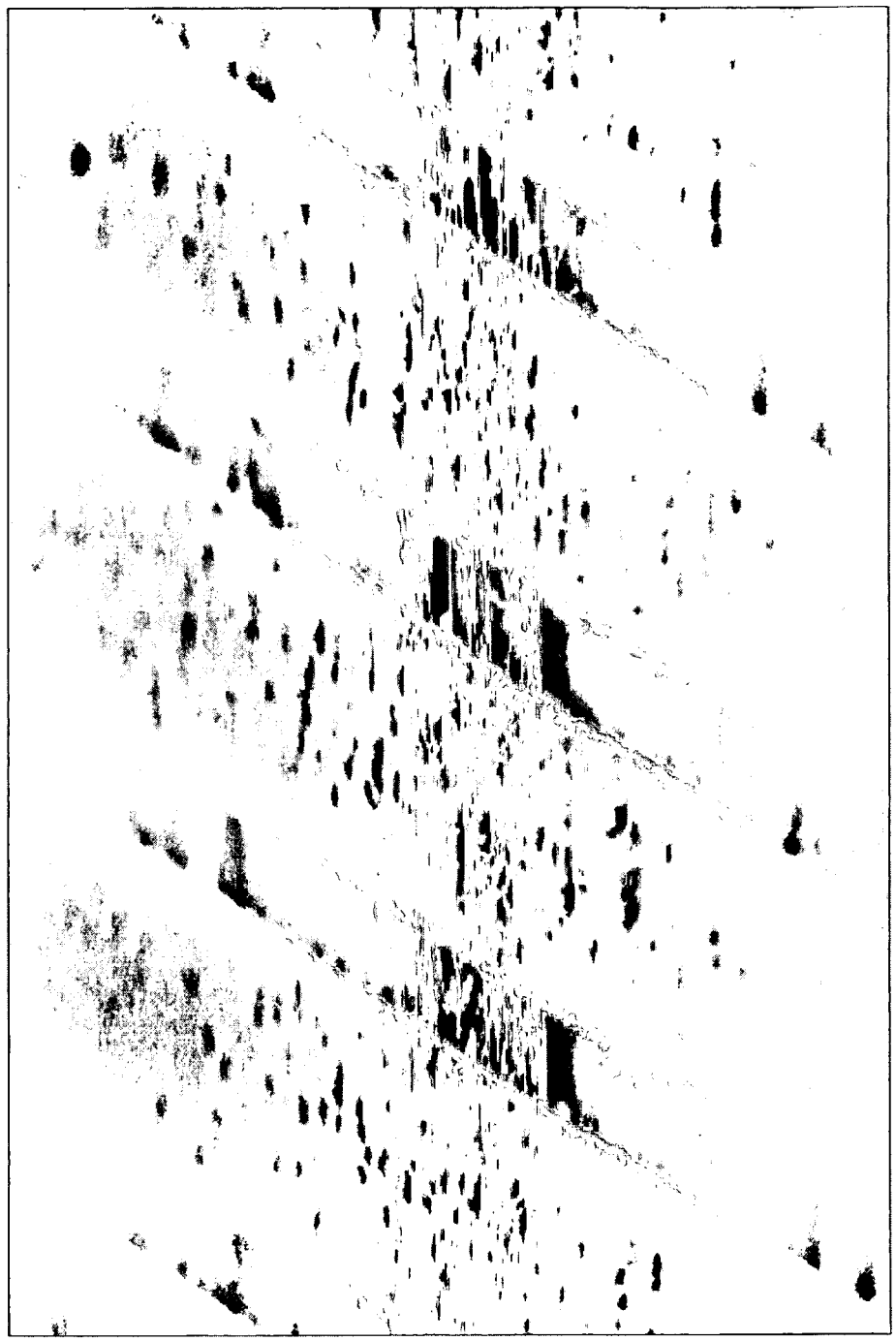
FIG. 10 is an image of an exemplary nanofabric shown in perspective.

FIG. 10 is an image of an exemplary fabric of nanotubes shown in perspective. As can be seen, the fabric may be highly porous and appear as several threads with gaps in between. In this figure there are actually several ribbons of nanofabric extending from left to right separated from one another by areas with no nanotubes. One may notice that the fabric of FIG. 7 is likewise very porous with a few nanotubes spanning the channel and contacting electrodes. In both figures, the resolution of the figure is affected by the imaging technology so some nanotubes may not appear in focus or be noticeable.

Other Variations

Note that the electrodes, e.g. the top electrode 168, may themselves be formed of nanofabric materials. In some embodiments, having a nanofabric ribbon or other nanofabric article disposed above the movable nanofabric element 172 instead of a metallic electrode permits removal of sacrificial materials from below the top electrode. Fluid may flow through a nanofabric material disposed above a sacrificial layer to remove the sacrificial material. Likewise, the lower electrode may be formed of a nanofabric material if desired.

Under certain preferred embodiments as shown in FIGS. 2(A)-(B), a nanotube patch 154 has a width of about 180 nm and is strapped, clamped, or pinned to a support 102 preferably fabricated of silicon nitride. The local area of lower electrode 112 under patch 154 forms an n-doped silicon electrode and is positioned close to the supports 110 and preferably is no wider than the patch, e.g., 180 nm. The relative separation from the top of the support 102 to the deflected position where the patch 154 attaches to electrode 112 (FIG. 2(B)) should be approximately 5-50 nm. The magnitude of the separation (180 or 186) is designed to be compatible with electromechanical switching capabilities of the memory device. For this embodiment, the 5-50 nm separation is preferred for certain embodiments utilizing patch 154 made from carbon nanotubes, but other separations may be preferable for other materials. This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube patch 154 of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.)

While the inventors typically desire a monolayer fabric of single-walled nanotubes, for certain applications it may be desirable to have multilayer fabrics to increase current density, redundancy or other mechanical or electrical characteristics. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface derivitization, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

The effect of the van der Waals interaction between nanofabrics and other elements can be affected at their interface(s). The effect may be enhanced or diminished; for example, the attractive force can be diminished by coating the surface of the electrode with a thin layer of oxide or other suitable chemicals. Volatile nanoswitches may also be made by employing such techniques instead of or in addition to controlling the gap dimension between a patch and electrode. Such volatile switches may be especially useful in applications such as relays, sensors, transistors, etc.

As the vertical separation between the patch and the underlying electrode increases, the switch becomes volatile when the deflected nanofabric has a strain energy greater than that of the van der Waals force keeping the fabric in contact with the underlying electrode. The thicknesses of insulating layers which control this separation can be adjusted to generate either a non-volatile or volatile condition for a given vertical gap as called for by particular applications with desired electrical characteristics.

Other embodiments involve controlled composition of carbon nanotube fabrics. Specifically, methods may be employed to control the relative amount of metallic and semiconducting nanotubes in the nanofabric. In this fashion, the nanofabric may be made to have a higher or lower percentage of metallic nanotubes relative to semiconducting nanotubes. Correspondingly, other properties of the nanofabric (e.g., resistance) will change. The control may be accomplished by direct growth, removal of undesired species, or application of purified nanotubes. Numerous ways have been described, e.g. in the incorporated references, supra, for growing and manufacturing nanofabric articles and materials.

The U.S. Patent Applications, identified and incorporated above, describe several (but not limiting) uses of nanofabrics and articles made therefrom. They also describe various ways of making such nanofabrics and devices. For the sake of brevity, various aspects disclosed in these incorporated references are not repeated here. For example, the various masking and patterning techniques for selectively removing portions of the fabric are described in these applications; in addition, various ways of growing nanofabrics or of forming nanofabrics with preformed nanotubes are described in these applications.

As explained in the incorporated references, a nanofabric may be formed or grown over defined regions of sacrificial material and over defined support regions. The sacrificial material may be subsequently removed, yielding suspended articles of nanofabric. See, for example, Electromechanical Memory Array Using Nanotube Ribbons and Method for Making Same (U.S. patent application Ser. No. 09/915,093) filed Jul. 25, 2001, for an architecture which suspends ribbons of nanofabric.

The articles formed by preferred embodiments help enable the generation of nanoelectronic devices and may also be used to assist in increasing the efficiency and performance of current electronic devices using a hybrid approach (e.g., using nanoribbon memory cells in conjunction with semiconductor addressing and processing circuitry).

It will be further appreciated that the scope of the present invention is not limited to the above-described embodiments but rather is defined by the appended claims, and that these claims will encompass modifications and improvements to what has been described.

What is claimed is:

1. A discrete electro-mechanical device, comprising:
a structure including a control structure, the control structure including an electrically-conductive trace;
a defined patch of nanotube fabric disposed in spaced relation to the control structure, the nanotube fabric comprising a film of nanotubes; and
wherein the defined patch of nanotube fabric is electro-mechanically deflectable between a first and second state, wherein in the first state the nanotube article is in spaced relation relative to the control structure, and wherein in the second state the nanotube article is in contact with the control structure; and
a low resistance signal path in electrical communication with the defined patch of nanofabric.

2. The discrete electro-mechanical device of claim 1 wherein the low resistance signal path is a metal signal path in contact with the defined patch of nanotube fabric.

3. The discrete electro-mechanical device of claim 1 wherein the structure includes a defined gap into which the electrically conductive trace is disposed, wherein the defined gap has a defined width, and wherein the defined patch of nanotube fabric spans the gap and has a longitudinal extent that is slightly longer than the defined width of the gap.

4. The discrete electro-mechanical device of claim 1 wherein the control structure includes an insulating layer disposed on a surface of the electrically-conductive trace facing the defined patch of nanotube fabric.

* * * * *